(12) United States Patent
Liu

(10) Patent No.: US 12,249,265 B2
(45) Date of Patent: Mar. 11, 2025

(54) DISPLAY PANEL AND DISPLAY DEVICE

(71) Applicant: Shanghai Tianma Micro-electronics Co., Ltd., Shanghai (CN)

(72) Inventor: Shaowei Liu, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 0 days.

(21) Appl. No.: 18/408,974

(22) Filed: Jan. 10, 2024

(65) Prior Publication Data

US 2024/0355252 A1    Oct. 24, 2024

(30) Foreign Application Priority Data

Apr. 23, 2023  (CN) .......................... 202310444436.9

(51) Int. Cl.
*G09G 3/20* (2006.01)
*H10K 59/131* (2023.01)

(52) U.S. Cl.
CPC .............. *G09G 3/20* (2013.01); *H10K 59/131* (2023.02); *G09G 2300/0819* (2013.01); *G09G 2300/0842* (2013.01); *G09G 2320/0209* (2013.01)

(58) Field of Classification Search
CPC ............. G09G 3/20; G09G 2300/0819; G09G 2300/0842; G09G 2320/0209; H10K 59/131
See application file for complete search history.

(56) References Cited

U.S. PATENT DOCUMENTS

| | | | |
|---|---|---|---|
| 2021/0012706 A1* | 1/2021 | Yang | G09G 3/32 |
| 2022/0069047 A1* | 3/2022 | Yang | H10K 59/131 |
| 2022/0173169 A1* | 6/2022 | Cai | H10K 59/121 |
| 2023/0260454 A1* | 8/2023 | Gu | H10K 59/121 |
| | | | 345/206 |
| 2023/0395770 A1* | 12/2023 | No | H01L 27/124 |

FOREIGN PATENT DOCUMENTS

| | | |
|---|---|---|
| CN | 213877387 U | 8/2021 |
| CN | 114937684 A | 8/2022 |

* cited by examiner

*Primary Examiner* — Hong Zhou
(74) *Attorney, Agent, or Firm* — Anova Law Group, PLLC

(57) ABSTRACT

A display panel includes first circuit groups and gate signal lines. The first circuit groups are in a transition region and arranged along a first direction to form a first circuit row. One or more first circuit rows are arranged along a second direction. The first direction intersects the second direction. An i-th row of the first circuit rows in are electrically connected to an i-th gate signal line, and adjacent first circuit groups have a first spacing region. The first spacing region has a dimension of L1 along the first direction. A j-th row of the first circuit rows is electrically connected to a j-th gate signal line, and adjacent first circuit groups along the j-th gate signal line have a second spacing region. The second spacing region has a dimension of L2 along the first direction, where L1>L2.

19 Claims, 17 Drawing Sheets

DISPLAY PANEL AND DISPLAY DEVICE

CROSS-REFERENCE TO RELATED APPLICATION

This application claims priority to Chinese Patent Application No. 202310444436.9, filed on Apr. 23, 2023, the entire content of which is incorporated herein by reference.

TECHNICAL FIELD

The present disclosure relates to the field of display technology and, in particular, to a display panel and a display device.

BACKGROUND

With the rapid development of electronic devices, users have high demands for an increasing screen-to-body ratio, which has led to a growing attention to full-screen display in the industry.

In order to make an electronic device has both a full-screen display and a light-sensing function, for example fingerprint recognition and a front camera in a display region, a light-sensing sensor is usually built under a screen. The light-sensing sensor adjusts the wiring and pixel arrangement in a corresponding region, making the corresponding region display and transmit light. By this means, the electronic device has both the full-screen display and the light-sensing function.

SUMMARY

Embodiments of the present disclosure provide a display panel and a display device to reduce the risk of abnormal display.

Embodiments of the present disclosure provide a display panel. The display panel has a first region, a second region, a transition region between the first region and the second region, first circuit groups, and gate signal lines. The transmittance of the first region is greater than that of the second region. The first circuit groups are located in the transition region. The first circuit groups are arranged along a first direction to form first circuit rows. The first circuit rows are arranged along a second direction. The first direction intersects the second direction. Along a direction parallel to the second direction and pointing from the center of the first region towards the second region, first circuit rows are sequentially arranged from a first row to an n-th row. An i-th row of the first circuit rows is electrically connected to an i-th gate signal line, and adjacent first circuit groups along the i-th gate signal line are separated by a first spacing region. The first spacing region has a dimension of L1 along the first direction. A j-th row of the first circuit rows is electrically connected to a j-th gate signal line, and adjacent first circuit groups along the j-th gate signal line are separated by a second spacing region. The second spacing region has a dimension of L2 along the first direction. L1 is greater than L2. Here, n, i, and j are integers, and $1 \leq j < i \leq n$.

Embodiments of the present application also provide a display device. The display device has a first region, a second region, a transition region between the first region and the second region, first circuit groups, and gate signal lines. The transmittance of the first region is greater than that of the second region. The first circuit groups are located in the transition region. The first circuit groups are arranged along a first direction to form first circuit rows. The first circuit rows are arranged along a second direction. The first direction intersects the second direction. Along a direction parallel to the second direction and pointing from the center of the first region towards the second region, first circuit rows are sequentially arranged from a first row to an n-th row. An i-th row of the first circuit rows is electrically connected to an i-th gate signal line, and adjacent first circuit groups along the i-th gate signal line are separated by a first spacing region. The first spacing region has a dimension of L1 along the first direction. A j-th row of the first circuit rows is electrically connected to a j-th gate signal line, and adjacent first circuit groups along the j-th gate signal line are separated by a second spacing region. The second spacing region has a dimension of L2 along the first direction. L1 is greater than L2. Here, n, i, and j are integers, and $1 \leq j < i \leq n$.

BRIEF DESCRIPTION OF THE DRAWINGS

In order to better illustrate the technical solutions of embodiments of the present disclosure, the following description will briefly introduce the accompanying drawings that are used in the embodiments. Obviously, the accompanying drawings in the following description are only some embodiments of the present disclosure. Those persons of ordinary skill in the art can also obtain other drawings based on the illustrated drawings without inputting creative efforts.

Figure 1:
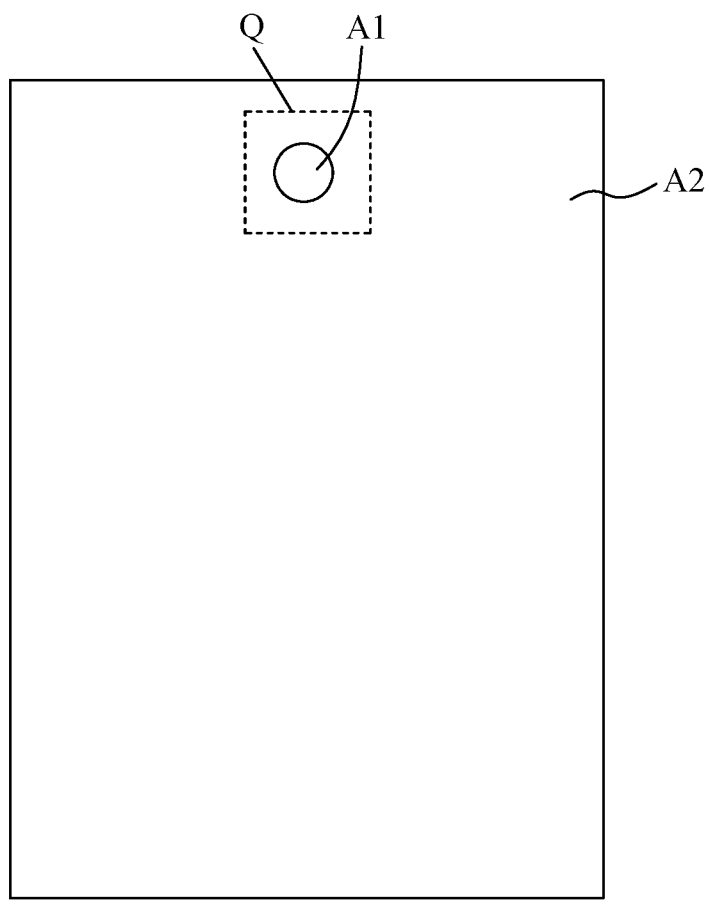
FIG. 1 illustrates a schematic diagram of the structure of a display panel according to embodiments of the present disclosure.

Numeral references: 1: Display panel; 2: Display device; 10: First circuit group; 10*a*: First type circuit group; 10*b*: Second type circuit group; 11: First driving circuit; 11*a*: First type driving circuit; 11*b*: Second type driving circuit; 20: Gate signal line; 20*i*: i-th gate signal line; 20*j*: j-th gate signal line; 21: First segment; 22: Second segment; 30: Second circuit group; 31: Second driving circuit; 40: Data line; 41: First data line; 42: Second data line; 43: Third data line; 50: First light-emitting unit; 61: First conductive part; 62: Second conductive part; H: First circuit row; Hi: i-th row of the first circuit row; Hj: j-th row of the first circuit row; B1: First connection part; B2: Second connection part; Z: First virtual line; D: Connection end; G1: First spacing region; G2: Second spacing region; G3: Third spacing region; A1: First region; A2: Second region; A3: Transition region; A31: First transition region; A32: Second transition region; and X: First direction; Y: Second direction.

DETAILED DESCRIPTION OF THE EMBODIMENTS

Features and exemplary embodiments of various aspects of the present disclosure will be described in detail below. In the following detailed description, numerous specific details are set forth in order to provide a comprehensive understanding of the present disclosure. It will be apparent, however, to persons of ordinary skill in the art that the present application could be practiced without some of these specific details. The description of the embodiments below is only intended to illustrate examples of the present application for a better understanding thereof.

The terms such as "first" and "second" are used merely to distinguish one entity or operation from another entity or operation, and do not necessarily require or imply any actual relationship or order between these entities or operations. Additionally, the terms "comprising", "including", or any other variant thereof, are intended to encompass a non-exclusive inclusion, such that a process, method, article, or apparatus comprising a series of elements includes not only those elements explicitly listed, but also include other elements that are not explicitly listed but are inherent to such process, method, article, or apparatus. In the absence of further limitations, an element defined by a statement that includes the term "comprising" does not exclude the presence of additional identical elements in a process, method, article, or apparatus that includes the element.

In a full-screen display device, the display panel includes a light-sensing region, a display region, and a transition region located between the light-sensing region and the display region. A light-sensing device is arranged in the corresponding position of the light-sensing region of the display panel. During the use of the display panel, both the light-sensing region and the display region need to achieve display effects to meet the requirements of a full-screen display.

During a design phase of the display panel, in order to accommodate the placement of the light-sensing region at any positions, data lines and gate signal lines that are used to drive the illumination of the light-sensing region need to keep continuously extended. Typically, the gate signal lines are arranged in the transition region and bypass the light-sensing region. This results in varying lengths between the gate signal lines, leading to different loads between each gate signal line and affecting display uniformity.

To address the above-mentioned issue, as shown in FIG. 1 to FIG. 4, embodiments of the present disclosure provide a display panel 1. The display panel 1 includes a first region A1, a second region A2, and a transition region A3 between the first region A1 and the second region A2. A transmittance of the first region A1 is greater than a transmittance of the second region A2.

The display panel 1 includes first circuit groups 10 and gate signal lines 20. The first circuit groups 10 are located in the transition region A3. The first circuit groups 10 are arranged along a first direction X to form first circuit rows H. The first circuit rows H are arranged along a second direction Y, where the first direction X intersects the second direction Y.

In a direction parallel to the second direction Y and from the center of the first region A1 to the second region A2, the first circuit row H is sequentially arranged from a first row to an n-th row. An i-th row of the first circuit rows Hi is electrically connected to an i-th gate signal line 20*i*, and adjacent first circuit groups 10 have a first spacing region G1. The first spacing region G1 has a dimension of L1 along the first direction X. A j-th row of the first circuit rows Hj is electrically connected to a j-th gate signal line 20*j*, and adjacent first circuit groups 10 along the j-th gate signal line 20*j* are separated by a second spacing region G2. The second spacing region G2 has a dimension of L2 along the first direction X, where L1>L2, n, i, and j are all integers, and $1 \leq j < i \leq n$.

Optionally, the first region A1 corresponds to the light-sensing region of the display panel 1, while the second region A2 corresponds to the primary region to achieve a display effect in the display panel 1. The first region A1 of the display panel 1 can be equipped with a light-sensing device such as a camera, and both the first region A1 and the second region A2 are provided with light-emitting units to meet the requirements of full-screen display. The dimensions and shapes of the first region A1 and the second region A2 are not limited in the present disclosure. For example, the first region A1 can have a circular or waterdrop shape.

A transition region A3 is positioned around the outer side of the first region A1, and dimension and shape of the transition region A3 are not limited in the present disclosure. For example, the outer contour of the transition region A3 can have a circular structure.

To enhance the transmittance of the first region A1 and meet the light-sensing requirements of the display panel 1, at least a portion of the first circuit groups 10 and the gate signal lines 20 are arranged in the transition region A3. Among them, the first circuit group 10 includes one or more driving circuits, which are used to drive the light-emitting units located in the transition region A3 or in the first region A1 to emit light, thereby achieving the full-screen display.

Multiple first circuit groups 10 are arranged side-by-side along the first direction X to form a first circuit row H, and multiple first circuit rows H are arranged side-by-side along the second direction Y. For example, the first direction X is perpendicular to the second direction Y. The quantity of first circuit groups 10 in the first circuit row H can be two, three, or even more, and quantity of first circuit groups 10 in different first circuit rows H can be the same or different. The present disclosure does not impose any restrictions on this.

Figure 2:
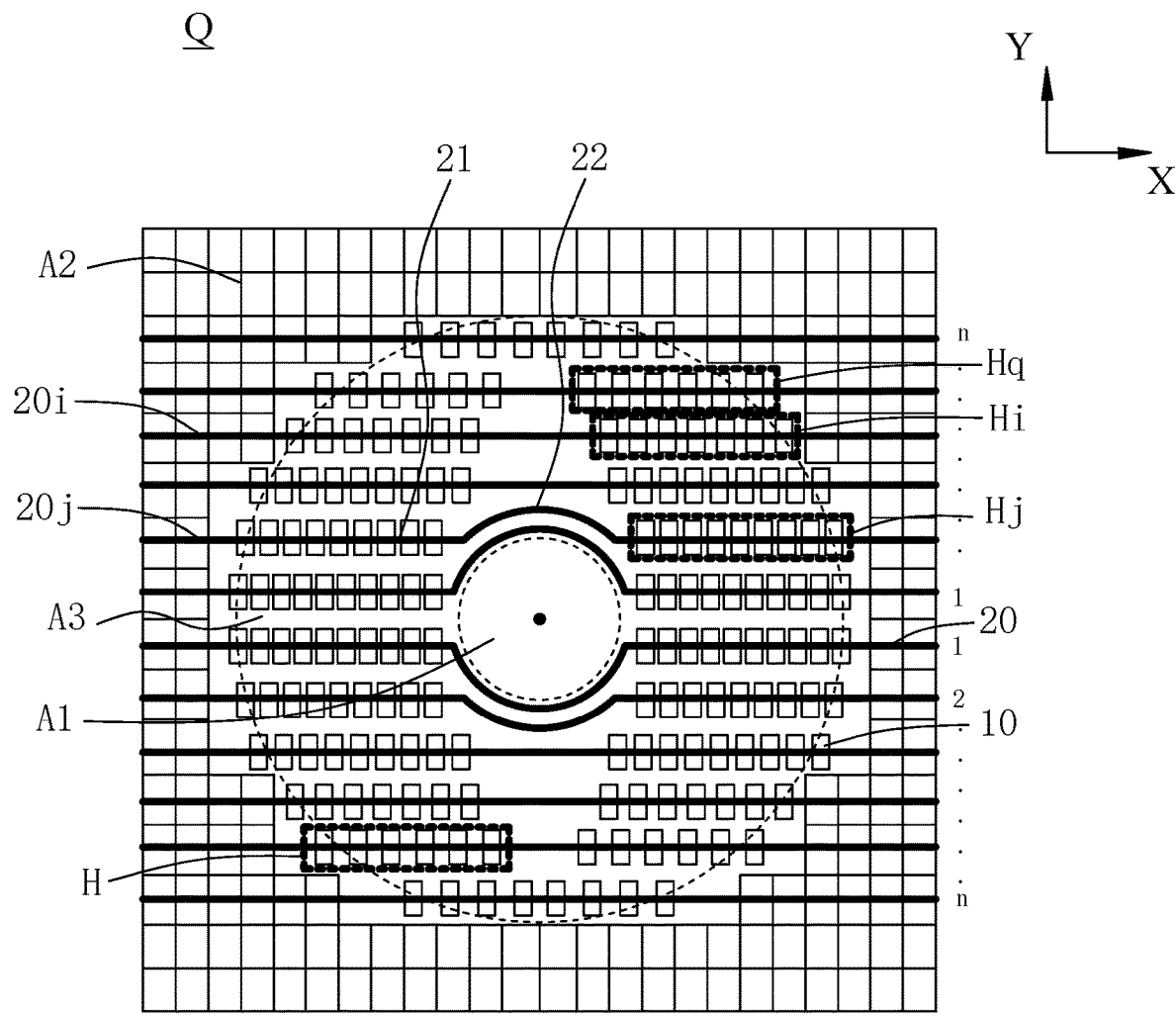
FIG. 2 illustrates an enlarged schematic diagram of the structure of region Q in FIG. 1.

The first circuit rows H are all located in the transition region A3. The transition region A3 is divided into two regions by the first region A1 along the first direction X. The first circuit rows H can be positioned in only one of the two regions, i.e., the first circuit rows H are located simultaneously in one side of the first region A1 along the first direction X. Alternatively, as shown in FIG. 2, the first circuit rows H are placed in both regions, i.e., distributed in both sides of the first region A1 along the first direction X.

The first circuit rows H are sequentially arranged from the first row to the n-th row along a direction parallel to the second direction Y and from the center of the first region A1 towards the second region A2. In FIG. 2, the center of the first region A1 is represented by a dot, and the first circuit rows H are indicated by numbers from the first row to the n-th row. As shown in FIG. 2, it can be observed that the "direction from the center of the first region A1 towards the second region A2" mentioned in embodiments of the present disclosure can be either upward from the center of the first region A1 towards the upper second region A2 or downward from the center of the first region A1 towards the lower second region A2. For the convenience in description, embodiments of the present disclosure will be further explained by exemplarily using the direction from the center of the first region A1 towards the upper second region A2.

Along the second direction Y, the first row of the first circuit rows H is the closest to the center of the first region A1, and the n-th row of the first circuit rows H is the farthest from the center of the first region A1. The i-th row of the first circuit row Hi is located in a region of the j-th row of the first circuit rows Hj away from the center of the first region A1, such that the distance between the i-th row of the first circuit rows Hi and the center of the first region A1 along the second direction Y is greater than the distance between the j-th row of the first circuit rows Hj and the center of the first region A1 along the second direction Y.

The gate signal lines 20 include a scanning signal line for providing a scanning signal and a light control signal line for providing light control signal. One gate signal line 20 corresponds to one first circuit row H. Specifically, one gate signal line 20 can pass through and connect at least a portion of the first circuit groups 10 located in one first circuit row H. Furthermore, one gate signal line 20 can pass through and connect all the first circuit groups 10 located in one first circuit row H. The i-th gate signal line 20$i$ can electrically connect to the i-th row of the first circuit rows Hi, and the j-th gate signal line 20$j$ can electrically connect to the j-th row of the first circuit rows Hj.

Figure 5:
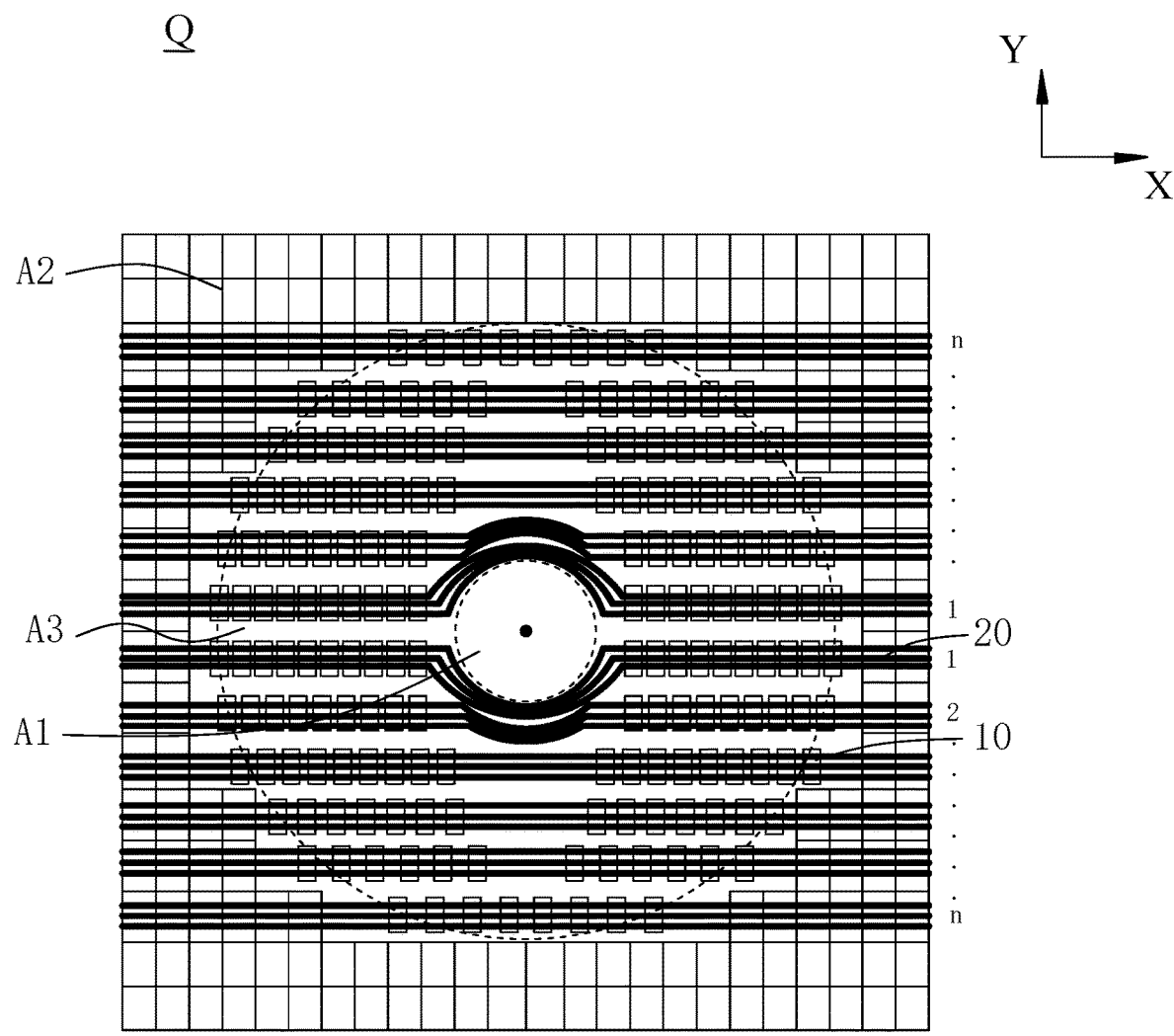
FIG. 5 illustrates an enlarged schematic diagram of the structure of region Q of a display panel according to embodiments of the present disclosure.

It should be noted that for one first circuit row H, it can be associated with only one connected gate signal line 20 or multiple connected gate signal lines 20. As shown in FIG. 2, it illustrates a situation where one first circuit row H is connected to only one gate signal line 20. Alternatively, as shown in FIG. 5, it illustrates a situation where one first circuit row H is simultaneously connected to multiple first gate signal lines 20.

Figure 6:
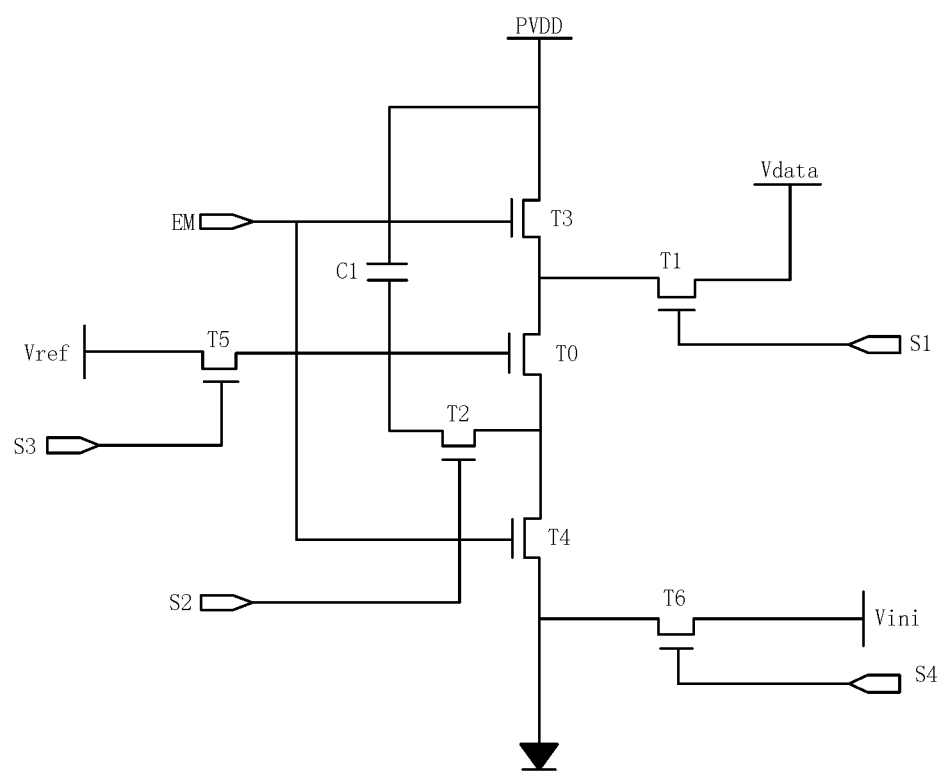
FIG. 6 illustrates a schematic diagram of a circuit structure of a driving circuit of a first circuit group in a display panel according to embodiments of the present disclosure.

As shown in FIG. 6, in conjunction with a driving circuit of the first circuit group 10, the driving circuit can have various forms, including 7TIC and 8TIC. For different types of the driving circuit, quantity of gate signal lines 20 required to connect to a single driving circuit can be same or different. FIG. 6 illustrates the structure when the driving circuit is 7TIC, where the gate signal lines 20 can include signal lines connected to S1, S2, S3, S4, and EM signals.

Due to differences in factors including extension length, a self-load of the j-th gate signal line 20$j$ is different from a self-load of the i-th gate signal line 20$i$, resulting in varying signal transmission effects and potentially causing issues like display anomalies.

To address this issue, embodiments of the present disclosure adjust an arrangement of the first circuit group 10 to reduce the load disparity between the i-th gate signal line 20$i$ and the j-th gate signal line 20$j$. Specifically, when two conductive structures are spaced apart, a lateral capacitance is formed. The larger the distance between the horizontally placed two conductive structures, the more space is available to generate an edge electric field, resulting in a corresponding larger lateral capacitance. In embodiments of the present disclosure, the first circuit groups 10 in the first circuit rows H are spaced apart from each other, also generating lateral capacitances. The lateral capacitance affects the gate signal lines 20 electrically connected to the first circuit groups 10, resulting in increased load on the gate signal lines 20.

Embodiments of the present disclosure set the dimension L1 along the first direction X between adjacent first circuit groups 10 in the i-th row of the first circuit rows Hi to be greater than the dimension L2 along the first direction X between adjacent first circuit groups 10 in the j-th row of the first circuit rows Hj. This ensures that the lateral capacitance in the i-th row of the first circuit rows Hi is greater than the lateral capacitance in the j-th row of the first circuit rows Hj, thereby optimizing the balance of the load disparity between the i-th gate signal line 20$i$ and the j-th gate signal line 20$j$. This helps to align their loads and ensure that the transmission signal effects are consistent, reducing the risk of display abnormalities.

Figure 11:
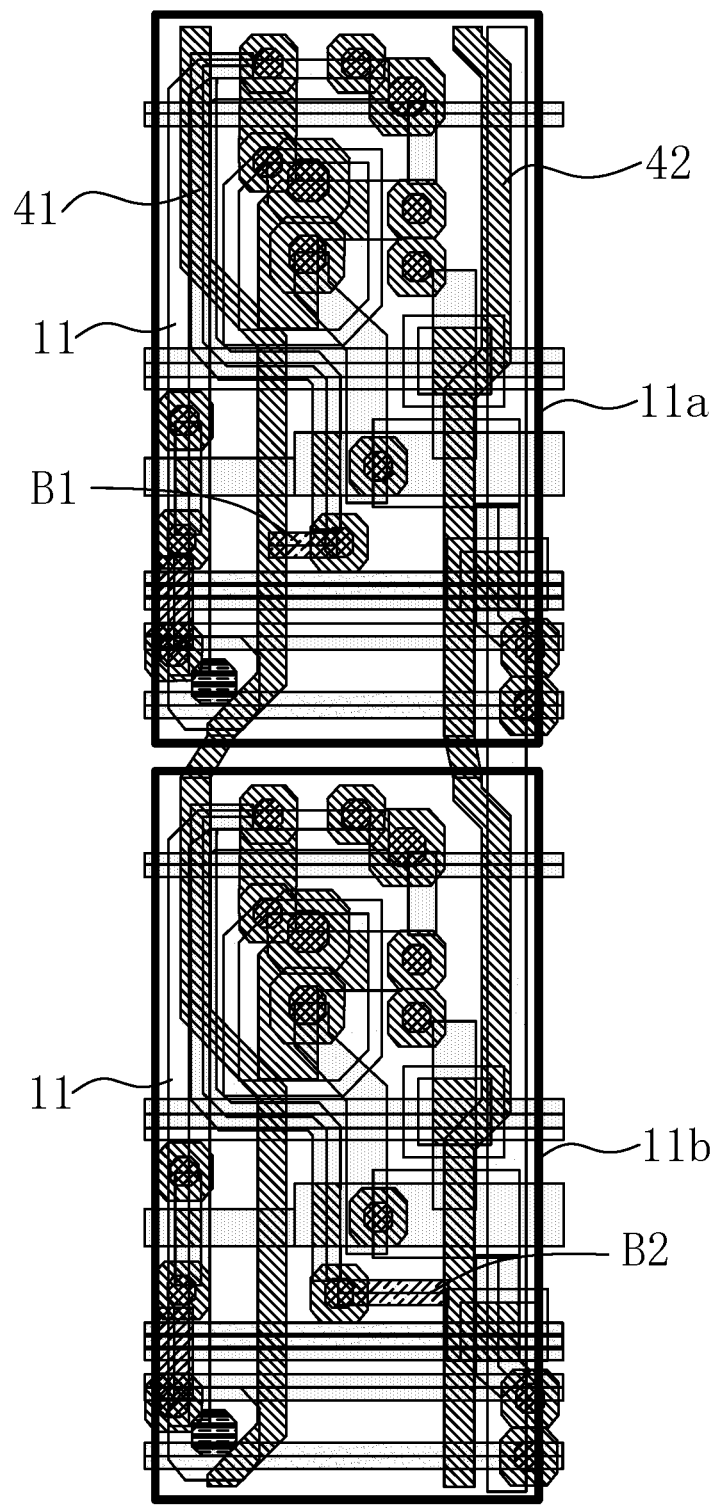
FIG. 11 illustrates a layout diagram of the structure of first driving circuits in a display panel according to embodiments of the present disclosure.

It should be noted that embodiments of the present disclosure do not impose specific values for i, j, and n, j can be 1 or any other integers less than i; i can be n or any integers greater than j and less than n. Furthermore, regarding the first circuit groups 10, as shown in FIG. 11, the first circuit groups 10 include first driving circuits 11, and each first driving circuit 11 does not have a specific shape, e.g., rectangle. Therefore, the first circuit groups 10 is not of a specific shape. Based on this, as shown in FIG. 11, the first driving circuits 11 is enclosed by a box, as an example. The dimension of the box can be determined based on practical considerations, and exemplarily, the box should cover at least 90% of the structures of the first driving circuit 11. In this case, L1 can be the spacing distance along the first direction X between the two boxes corresponding to the two nearest first driving circuits 11 in the adjacent first circuit groups 10 in the i-th row of the first circuit rows Hi.

For the first circuit rows H, distances between different adjacent first circuit groups 10 can be the same or different, and the present disclosure does not impose any restrictions. When the distances between different adjacent first circuit groups 10 in the first circuit rows H are not the same, L1 and L2 represent average spacings between adjacent first circuit groups 10 in the i-th row of the first circuit rows Hi and the j-th row of the first circuit rows Hj, respectively.

In some embodiments, as shown in FIG. 2, along a direction parallel to the second direction Y and from the center of the first region A1 towards the second region A2, the spacing between adjacent first circuit groups 10 along the first direction X gradually increases between any two adjacent first circuit rows H.

The spacing between adjacent first circuit groups 10 in the first circuit rows H exhibits a gradual change trend along the second direction Y. The change trend includes linear change and exponential change. Compared to other approaches, this design allows for a more compact arrangement of the first circuit groups 10 and reduces the degree of variation between adjacent first circuit rows H.

In general, gate signal lines 20 used to connect adjacent first circuit rows H are often positioned close to each other, and their extension lengths are also similar. Therefore, embodiments of the present disclosure control the spacing between adjacent first circuit groups 10 to gradually change, resulting in the corresponding lateral capacitance of the adjacent first circuit rows H being more similar. This helps to reduce the impact of lateral capacitance on the adjacent gate signal lines 20, thereby reducing the load differences between adjacent gate signal lines 20.

Figure 7:
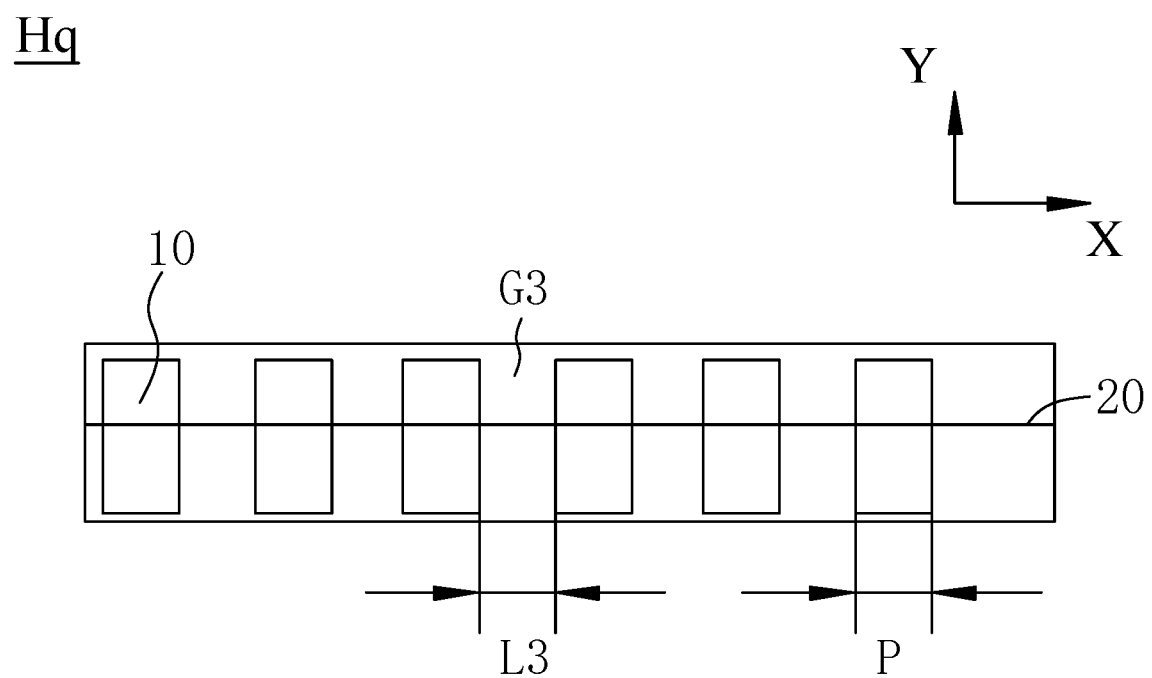
FIG. 7 illustrates an enlarged schematic diagram of the structure of the q-th row of first circuit rows in FIG. 2.

In some embodiments, as shown in FIG. 2 and FIG. 7, the first circuit groups 10 have a dimension of P along the first direction X. Between adjacent first circuit groups 10 in the q-th row of the first circuit rows H, there is a third spacing region G3. A dimension of the third spacing region G3 along the first direction X is L3. $L3=P*a^{b^{q^c}}-P$. Here, q, a, b, and c are constants, and $1.0002 \leq a \leq 1.001$, $1.0002 \leq b \leq 1.001$, $30 \leq c \leq 50$, and $1 \leq q \leq n$.

P is the dimension of the first circuit groups 10 along the first direction X. Each first circuit group 10 can have a same or a different size along the first direction X. When different first circuit groups 10 have different sizes along the first direction X, P can represent an average dimension of a corresponding first circuit groups 10 of the first circuit rows H along the first direction X. The dimension of P depends on factors such as quantity and arrangement of driving circuits in the first circuit groups 10, and the present disclosure does not impose any restrictions on it.

q, a, b, and c are all constants, and their respective values collectively determine the limitation on the dimension of the third spacing region along the first direction X. From the formula: $L3=P*a^{b^{q^c}}-P$, it can be observed that the spacing between the adjacent first circuit groups 10 follow an exponential change. Compared to linear or other types of changes, this allows for a more compact arrangement of the first circuit groups 10 near the center of the first region A1, while creating a more dispersed arrangement of the first circuit groups 10 away from the center of the first region A1.

In embodiments of the present disclosure, by controlling the spacing between the first circuit groups 10 to follow an exponential change, the arrangement of the first circuit groups 10 in the transition region A3 is optimized. This results in a more compact arrangement of the first circuit groups 10, thereby reducing the space occupied by first circuit groups 10. This facilitates minimizing the impact of the first circuit groups 10 on the display quality and enhances the quality of full-screen display.

Figure 8:
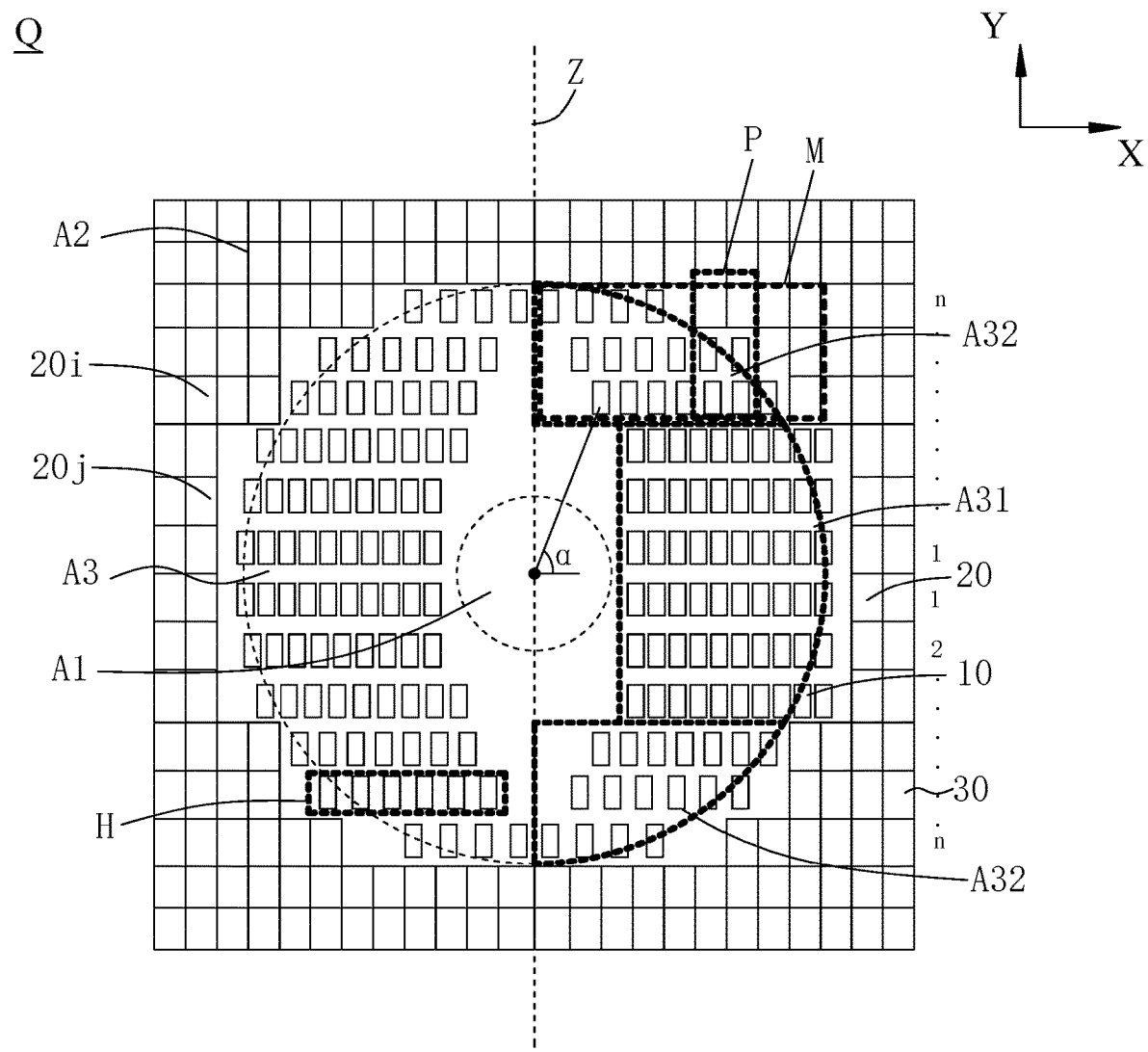
FIG. 8 illustrates a partially enlarged schematic diagram of region Q of a display panel according to embodiments of the present disclosure.

In some embodiments, please refer to FIG. 8. Along a direction parallel to the second direction Y and from the center of the first region A1 towards the second region A2, the transition region A3 sequentially includes a first transition region A31 and a second transition region A32. Within the first transition region A31, at least a portion of different first circuit rows H have equal spacing between adjacent first drive circuits 11 along the first direction X. In at least a portion of first circuit rows H of the second transition region A32, the adjacent first circuit groups 10 have a greater spacing along the first direction X than the adjacent first circuit groups 10 in first circuit rows H of the first transition region A31. In FIG. 8, the first transition region A31 and the second transition region A32 are represented by bold dashed lines.

Along the second direction Y, the first transition region A31 is located on one side of the second transition region A32 facing towards the center of the first region A1. Two second transition regions A32 can be configured with one on each side of the first transition region A31 along the second direction Y.

Along the first transition region A31, the adjacent first circuit groups 10 in at least some different first circuit rows H have a same spacing along the first direction X. Optionally, in the first transition region A31, the adjacent first circuit groups 10 in each first circuit row H have equal spacing along the first direction X, which allows for a compact and ordered arrangement of the first circuit groups 10 in the first transition region A31, thereby helping to reduce a dimension of the transition region A3. For example, the outer contour of the transition region A3 is a circular structure with a diameter of 5500 μm, compared to a commonly seen value, 6700 μm. Therefore, embodiments of the present disclosure help to reduce the dimension of the transition region A3, thereby improving the display quality of the display panel.

Compared to the first transition region A31, the adjacent first circuit rows H in the second transition region A32 have a larger spacing along the first direction X, resulting in larger corresponding lateral capacitance. This facilitates balancing the load of the gate signal lines 20 and improves the consistency of signal transmission.

In embodiments of the present disclosure, the transition region A3 is divided into the first transition region A31 and the second transition region A32. Adjustments are made to the arrangement of the first circuit group 10 in the first transition region A31 and the second transition region A32. This results in a more compact arrangement of the first circuit groups 10 in the first transition region A31 and a more dispersed arrangement in the second transition region A32. This facilitates load balancing and improves the reliability of signal transmission. Additionally, this design minimizes the misalignment of adjacent first circuit rows H along the first direction X, which facilitates the coordinated connection between the first circuit group 10 and the data line 40 extending along the second direction Y.

It should be noted that, in the second transition region A32, the spacing between different adjacent first circuit groups 10 along the first direction X can be either the same or different. The spacing exhibits linear or exponential variation, which is not restricted by embodiments of the present disclosure.

In some embodiments, in the second transition region A32, the at least some spacings between adjacent first circuit groups 10 is equal to or less than the spacing between adjacent driving circuits in the first circuit group 10. In some embodiments, some first circuit groups 10 in the second transition region A32 can be positioned adjacent to each other.

In some embodiments, the minimum spacing between adjacent first circuit groups 10 along the first direction X in the second transition region A32 is greater than the maximum spacing between adjacent first circuit groups 10 in the first transition region A31. In some embodiments, the spacing between any adjacent first circuit groups 10 along the first direction X in the second transition region A32, is greater than the spacing between any adjacent first circuit groups 10 in the first transition region A31 along the first direction X.

The design described in some embodiments further optimizes the arrangement of the first circuit groups 10 in the transition region A3, making the arrangement of the first circuit groups 10 in the first transition region A31 more compact and the arrangement of the first circuit groups 10 in the second transition region A32 more dispersed. It also reduces the misalignment of adjacent first circuit rows H along the first direction X in the transition region A3, facilitating the connection between the first circuit group 10 and data lines 40.

Figure 9:
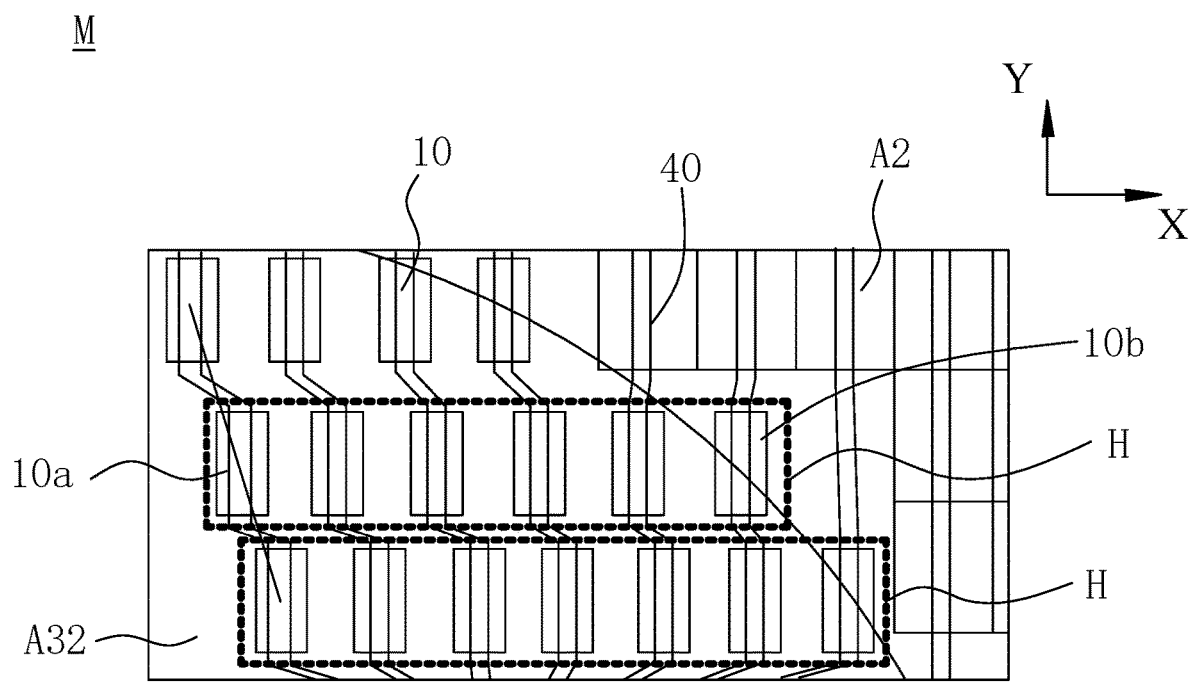
FIG. 9 illustrates an enlarged schematic diagram of the structure of region M in FIG. 8.

In some embodiments, as shown in FIG. 8 and FIG. 9, first circuit groups 10 include first type circuit groups 10a and second type circuit groups 10b located at both ends of the first circuit rows H. Along the first direction X, a distance between the first type circuit groups 10a and the second region A2 is greater than a distance between the second type circuit groups 10b and the second region A2. In some embodiments, at least three first type circuit groups 10a located in the second transition region A32 are positioned on a same straight line, and the extension direction of the same straight line intersects the second direction Y.

Each first circuit row H includes at least a first type circuit group 10a and a second type circuit group 10b located at each end. The second type circuit group 10b is positioned at the junction between the transition region A3 and the second region A2. At least three first type circuit groups 10a are located on a same straight line in the second transition region A32. The at least three first type circuit groups 10a are located in different first circuit rows H, and the two closest first type circuit groups 10a can be located in adjacent first circuit rows H or in two consecutively spaced first circuit rows H.

The term "at least three first type circuit groups 10a located on a same line" mentioned in some embodiments refers to the condition where at least three first type circuit groups 10a simultaneously overlap with the same straight line. Furthermore, any two corresponding positions of the at least three first type circuit groups 10a can be connected by a line, and they are all located on a same line. For example, a line connecting the centers of any two first type circuit groups 10a among the at least three first type circuit groups 10a is located on a same line. The inclination angle of the same line relative to the second direction Y is not limited in embodiments of the present disclosure. For example, the line can be inclined at an angle including 30°, 45°, or 60° relative to the second direction Y.

By arranging at least three first type circuit groups 10a on the same straight line in the second transition region A32, embodiments of the present disclosure ensure consistent misalignment of at least three first circuit rows H along the first direction X, thereby standardizing the arrangement of the first circuit groups 10 in the second transition region A32. This facilitates the passage and connection of the data lines 40 to the first circuit groups 10 located in the second transition region A32. Furthermore, each first type circuit group 10a located in the second transition region A32 is positioned on the same straight line.

In some embodiments, as shown in FIG. 8 and FIG. 9, at least some of the second type circuit groups 10b in different first circuit rows H located in the second transition region A32 are positioned on a same arc segment.

The term "at least some of the second type circuit groups 10b in different first circuit rows H located on the same arc segment" mentioned in some embodiments refers to the condition where at least some of the different second type circuit groups 10b simultaneously overlap with the same arc segment. Furthermore, the corresponding positions of at least some of the different second type circuit groups 10b can be sequentially connected, resulting in an arc segment.

As described above, the second type circuit groups 10b are located at a junction between the transition region A3 and the second region A2, and the position of the second type circuit group 10b determines the boundary position of the corresponding first circuit rows H. Based on this, in embodiments of the present disclosure, at least some of the second type circuit groups 10b in the second transition region A32 are arranged on the same arc segment. Compared to the scenario where the second type circuit groups 10b are positioned on the same straight line, the arc segment allows at least some of the first circuit groups 10 to be outwardly arranged. This optimizes the arrangement of the first circuit group 10 in the second transition region A32, enabling a more dispersed distribution of the first circuit groups 10 within the second transition region A32.

In some embodiments, as shown in FIG. 8 and FIG. 9, an angle α between a connecting direction of the first type circuit group 10a, which is in the second transition region A32 and closest to the first transition region A31, and the center of the first region A1 with respect to the first direction X satisfies: $30° \leq \alpha \leq 45°$.

The angle α determines the relative size of the first transition region A31 and the second transition region A32. Specifically, if the angle α is too large, the size of the first transition region A31 along the second direction Y becomes too large, while the dimension of the second transition region A32 along the second direction Y becomes too small. This leads to the scenario that the first circuit groups 10 being tightly arranged in the first transition region A31. Such dense arrangement in the first transition region A31 increases the risk of interference between the first circuit groups 10, leading to display abnormalities.

If the angle α is too small, the size of the second transition region A32 along the second direction Y becomes too large, while the dimension of the first transition region A31 along the second direction Y becomes too small. This causes excessive dispersion of the first circuit groups 10, which can be visually observed by the human eye and adversely affect the display quality.

Therefore, embodiments of the present disclosure set the angle α in a range of $30° \leq \alpha \leq 45°$ to reasonably regulate the dimension of the first transition region A31 and the dimension of the second transition region A32. This optimization aims to improve the arrangement of the first circuit groups 10 in the transition region A3 while ensuring reliable use of the display panel and reducing the impact of the first circuit groups 10 on the display quality. For example, the angle α can be 30°, 35°, 40°, or 45°, or any other angles between 30° and 45°. The present disclosure does not limit the specific value of the angle α.

As shown in FIG. 2, it is noted that a portion of the structures in the gate signal lines 20 near the first region A1 are arranged around the first region A1. Based on this, if the angle α is set too large, some of the first circuit groups 10 located in the second transition region A32 overlap and interfere with the portion of the structures surrounding the first region A1 in the gate signal lines 20, leading to display abnormalities. Conversely, if the angle α is set too small, the dimension of the second transition region A32 along the second direction Y becomes too small, resulting in a limited number of first circuit groups 10 and a waste of space.

In embodiments of the present disclosure, the angle α is set as $30° \leq \alpha \leq 45°$, which optimizes the arrangement of the first circuit groups 10 while reduces the probability of interference between certain first circuit groups 10 and gate signal lines 20, thereby improving the reliability of the display panel.

Figure 3:
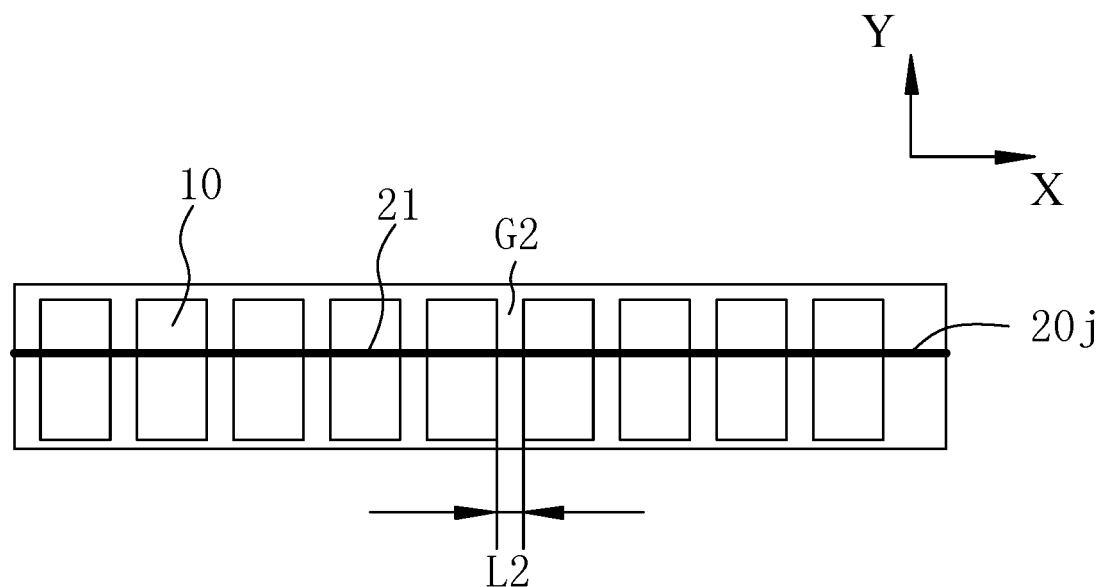
FIG. 3 illustrates an enlarged schematic diagram of the structure of the j-th row of first circuit rows in FIG. 2.
Figure 4:
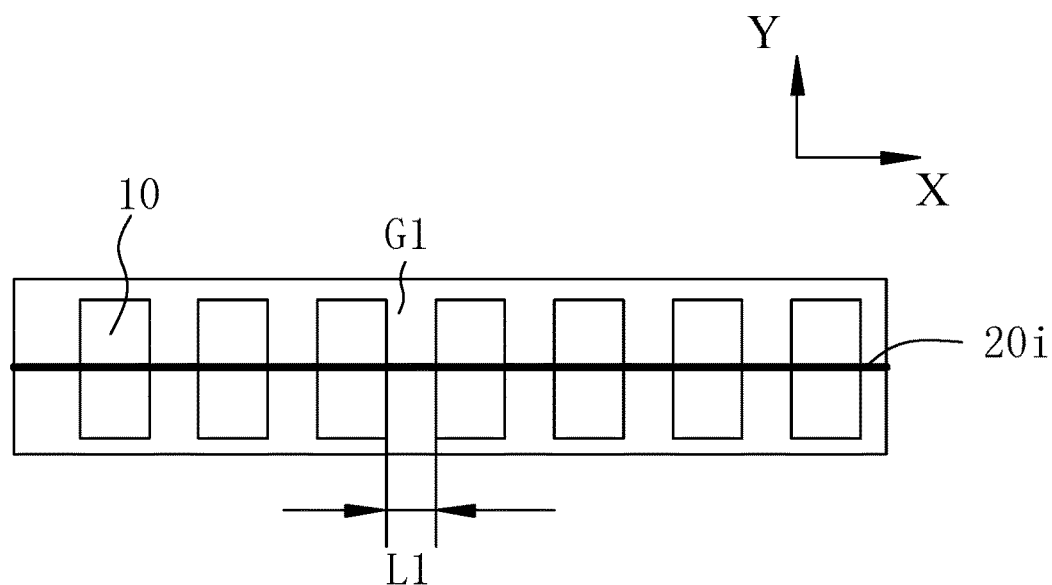
FIG. 4 illustrates an enlarged schematic diagram of the structure of the i-th row of first circuit rows in FIG. 2.

In some embodiments, as shown in FIG. 2 to FIG. 4, the gate signal lines 20 extend along the first direction X. In the transition region A3, an extension length of the j-th gate signal line 20j is greater than an extension length of the i-th gate signal line 20i, i.e., L1>L2.

The gate signal lines 20 extend along the first direction X. It should be noted that the "extend along the first direction X" means that the gate signal lines 20 exhibit a tendency to extend along the first direction X, rather than the gate signal lines 20 as a whole forming a straight-line structure extending along the first direction X. The gate signal lines 20 can have curved or segmented structures, and their local extension directions, in some embodiments, intersect the first direction X.

As the extension length of the j-th gate signal line 20j is greater than the extension length of the i-th gate signal line 20i, and the extension length is often positively correlated with the self-load of the gate signal line 20, the self-load of the j-th gate signal line 20j will be greater than the self-load of the i-th gate signal line 20i. This results in different signal transmission effects, which can lead to display anomalies and other issues.

Based on this, in embodiments of the present disclosure, the dimension L1 along the first direction X between adjacent first circuit groups 10 located in the i-th row of the first circuit rows Hi is set to be greater than the dimension L2 along the first direction X between adjacent first circuit groups 10 located in the j-th row of the first circuit rows Hj. This ensures that the lateral capacitance in the i-th row of the first circuit rows Hi is larger than the lateral capacitance in the j-th row of the first circuit rows Hj. Consequently, the i-th gate signal line 20i is affected by a larger lateral capacitance compared to the j-th gate signal line 20j, thereby optimizing and balancing the load difference between the i-th gate signal line 20i and the j-th gate signal line 20j. This ensures that their transmission effects are substantially consistent and reduces the risk of display anomalies.

In some embodiments, first circuit groups 10 are symmetrically distributed with respect to a first virtual line Z, which passes through the center of the first region A1 and extends parallel to the second direction Y.

As shown in FIG. 8, in embodiments of the present disclosure, the transition region A3 is arranged with the first circuit groups 10 on the left side of the first virtual line Z as well as the first circuit groups 10 on the right side of the first virtual line Z. The first circuit groups 10 located on both sides of the first virtual line Z are symmetrically distributed with respect to the first virtual line Z. This design allows for a uniform distribution of the first circuit groups 10 on both sides of the first region A1 along the first direction X, which is advantageous for optimizing the arrangement of the first circuit groups 10 in the transition region A3.

Figure 10:
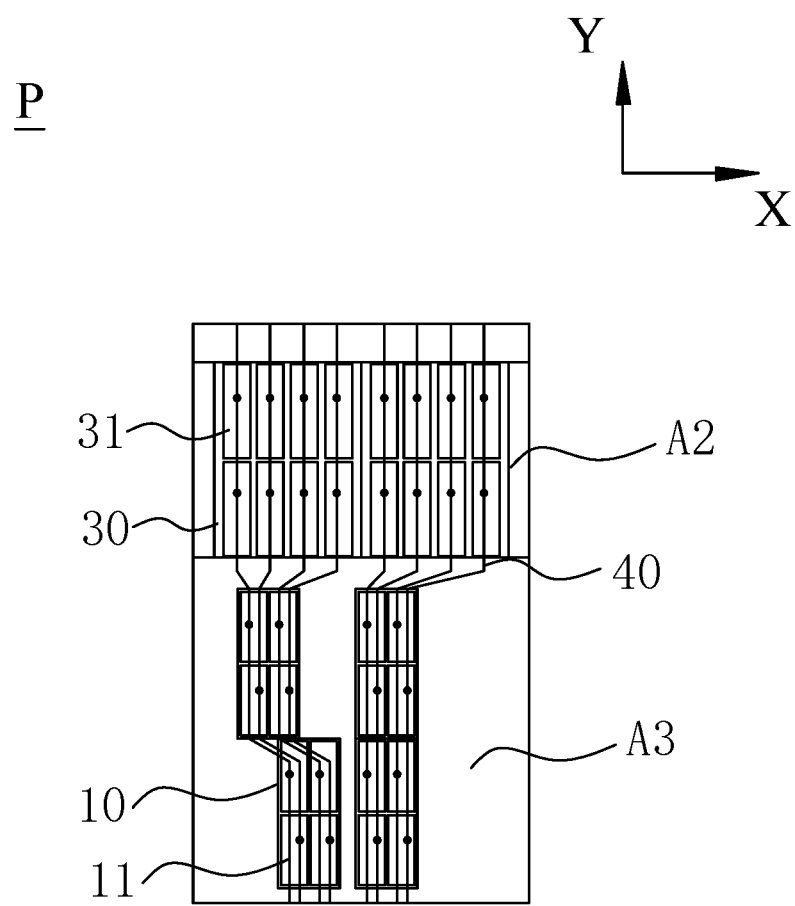
FIG. 10 illustrates an enlarged schematic diagram of the structure of region P in FIG. 8.

In some embodiments, please refer to FIG. 8 and FIG. 10, the display panel further includes second circuit groups 30 located in the second region A2. The first circuit groups 10 include first driving circuits 11, while the second circuit groups 30 include second driving circuits 31. Quantity of the first driving circuits 11 in one single first circuit group 10 is smaller than quantity of the second driving circuits 31 in one single second circuit group 30.

The first driving circuits 11 in the first circuit groups 10 are used to drive light emission from light-emitting units located in the transition region A3 or the first region A1. The second driving circuits 31 in the second circuit groups 30 are used to drive light emission from light-emitting units located in the second region A2. Furthermore, the first driving circuits 11 are arranged in an array to form the first circuit groups 10, and the first circuit groups 10 are repetitively repeated in the transition region A3, while the arrangement of the first driving circuits 11 being same in different first circuit groups 10.

The light-emitting units can form pixel repeating units, and the pixel repeating units are repetitively repeated to form a corresponding pixel layout structure. Based on this, one single first circuit group 10 can be used to drive light emission from the light-emitting units in a single pixel repeating unit. A same working mechanism applies to the second circuit groups 30, but further details are not elaborated in embodiments of the present disclosure.

In order to improve the display performance of the display panel, it is desirable to minimize the dimension of the transition region A3 and reduce its impact on the display performance. Therefore, in the present disclosure, the dimension of the first circuit groups 10 is limited to reduce the dimension of the transition region A3. By setting the quantity of the first driving circuits 11 in one single first circuit group 10 to be smaller than the quantity of the second driving circuits 31 in one single second circuit group 30, a dimension of one single first circuit group 10 becomes smaller than a dimension of one single second circuit group 30, achieving the goal of reducing the dimension of the transition region A3 and improving the display performance.

The quantity of first driving circuits 11 in one single first circuit group 10 and the quantity of second driving circuits 31 in one single second circuit group 30 are not limited in the present disclosure. Optionally, a quantity of columns of first driving circuits 11 in a single first circuit group 10 along the first direction X can be smaller than a quantity of columns of second driving circuits 31 in a single second circuit group 30 along the first direction X, or the quantity of rows of the first driving circuits 11 in one single first circuit group 10 along the second direction Y can be smaller than the quantity of rows of the second driving circuits 31 in one single second circuit group 30 along the second direction Y.

In some embodiments, as shown in FIG. 10, the quantity of rows of the second driving circuits 31 in a single second circuit group 30 along the second direction Y is the same as the quantity of rows of the first driving circuits 11 in one single first circuit group 10 along the second direction Y. Furthermore, the quantity of columns of the first driving circuits 11 in one single first circuit group 10 along the first direction X can be smaller than the quantity of columns of the second driving circuits 31 in one single second circuit group 30 along the first direction X.

The dimension of the first circuit groups 10 along the second direction Y is often determined by the quantity of rows of the first driving circuits 11 along the second direction Y, while the dimension of the second circuit group 30 along the second direction Y is often determined by the quantity of rows of the second driving circuits 31 along the second direction Y. Therefore, when the quantity of rows of the driving circuits in the first circuit group 10 matches the quantity of rows of the driving circuits in the second circuit group 30, it indicates that the dimensions of the first circuit groups 10 and the second circuit groups 30 along the second direction Y are relatively close. This allows for aligning and optimizing the arrangement of certain rows of the first circuit groups 10 and the second circuit groups 30 along the second direction Y during the design phase of the display panel.

In some embodiments, please refer to FIG. 8 and FIG. 10, the display panel further includes the data lines 40 that span across the transition region A3 along the second direction Y. Quantity of data lines 40 connecting to an individual second driving circuit 31 in one single second circuit group 30 is smaller than quantity of data lines 40 connecting to an individual first driving circuit 11 in one single first circuit group 10. In FIG. 10, the connection points between the data lines 40 and the first driving circuits 11, as well as the connection points between the data lines 40 and the second driving circuits 31, are represented by black endpoints.

The data lines 40 extend along the second direction Y and are used for transmitting data signals, where some data lines 40 pass through both the first circuit groups 10 and the second circuit groups 30. As mentioned earlier, the quantity of the first driving circuits 11 in one single first circuit group 10 is smaller than the quantity of the second driving circuits 31 in one single second circuit group 30. If the quantity of the data lines 40 connecting to the individual second driving circuit 31 in one single second circuit group 30 is set to be equal to the quantity of the data lines 40 connecting to the individual first driving circuit 11 in one single first circuit group 10, it would result in an excessive quantity of data lines 40 that cannot be connected to the first driving circuits 11, leading to congestion between adjacent first circuit groups 10. This is unfavorable for the arrangement of the data lines 40 and can result in significant load differences between different signal lines.

To address this issue, in the present disclosure, the quantity of data lines 40 connected to the first driving circuit 11 is adjusted so that the quantity of data lines 40 connecting to the individual second driving circuit 31 in one single second circuit group 30 is smaller than the quantity of data lines 40 connecting to the individual first driving circuit 11 in one single first circuit group 10. In conjunction with FIG. 8, it shows an example where FIG. 8 illustrates a first circuit group 10 including four first driving circuits 11 and a second circuit group 30 having eight second driving circuits 31. One single data line 40 connects two second driving circuits located in a same column of the second circuit group 30 and also connects a first driving circuit of the first circuit group 10.

This design ensures that more data lines 40 can be connected to the first driving circuits 11, reducing quantity of data lines 40 that are unable to be connected to the first driving circuits 11. As a result, quantity of data lines 40 between adjacent first circuit groups 10 is reduced, optimizing the layout of the data lines 40.

In some embodiments, as shown in FIG. 10, at least some different data lines 40 are used to connect first driving circuits 11 located in a same column along the second direction Y.

Typically, one single data line 40 connects the second driving circuits 31 located in the same column. However, due to the fact that the quantity of the second driving circuits 31 connected to one single data line 40 in a single second circuit group 30 is smaller than the quantity of the first driving circuits 11 connected to one single data line 40 in a single first circuit group 10, one single data line 40 will only connect a portion of the first driving circuits 11 located in the same column. Consequently, other data lines 40 are used to connect the remaining first driving circuits 11 in the same column to achieve the transmission of data signals.

In some embodiments, adjacent data lines 40 are used to connect the first driving circuits 11 located in a same column. This facilitates the layout between the data lines 40 and the first driving circuits 11, reduces the risk of cross-misalignment between different data lines 40, and ensures reliable signal transmission between different data lines 40.

The specific connection relationship between the data lines 40 and the first driving circuits 11 in the same column is not limited in the present disclosure. For example, one single data line 40 can simultaneously connect adjacent first driving circuits 11 in a same column.

In some embodiments, additional first driving circuits 11 are positioned between at least some of the first driving circuits 11 connected to one single data line 40. This means that adjacent first driving circuits 11 in a same column are controlled by different data lines 40.

This reduces the risk of excessive local loading caused by connecting too many first driving circuits 11 to one data line 40, which can lead to abnormal data signal transmission. Furthermore, this design optimizes the connection between the data lines 40 and the first driving circuits 11 in a same column, reducing risk of signal crosstalk between adjacent first driving circuits 11 and improving reliability of data signal transmission.

In some embodiments, as shown in FIG. 10 and FIG. 11, there are data lines 40, including adjacent first data lines 41 and second data lines 42. There are first driving circuits 11, including first type driving circuits 11a connected to the first data lines 41 and second type driving circuits 11b connected to the second data lines 42.

The first type driving circuits 11a include a first connection part B1, which is electrically connected to the first data lines 41. The second type driving circuits 11b include a second connection part B2, which is electrically connected to the second data lines 42. Along a direction of the display panel thickness, a projection of the first connection part B1 and a projection of the second connection part B2 are at least partially located between the first data lines 41 and the second data lines 42.

The first data lines 41 and the second data lines 42 are adjacent data lines 40 used to connect the first driving circuits 11 located in a same column along the first direction X. The first type driving circuits 11a and the second type driving circuits 11b are two first driving circuits 11 located in a same column.

The first type driving circuits 11a are electrically connected to the first data lines 41 through the first connection part B1, using connection methods including but not limited to a via connection. The second type driving circuits 11b are electrically connected to the second data lines 42 through the second connection part B2, using connection methods including but not limited to via connection. Typically, the first connection part B1 and the second connection part B2 are correspondingly positioned with respect to the first data lines 41 and the second data lines 42, respectively. However, due to the presence of a certain distance between the first data lines 41 and the second data lines 42 along the first direction X, there can be significant misalignment between the first connection part B1 and the second connection part B2 along the first direction X. This results in significant structural differences between the first type driving circuits 11a and the second type driving circuits 11b, increasing the design and manufacturing difficulties of the first driving circuits 11.

To reduce the manufacturing difficulties of the first driving circuits 11, in the present disclosure, structures of different first driving circuits 11 have been adjusted. Taking the first type driving circuits 11a and the second type driving circuits 11b as examples, the projections of the first connection part B1 and the second connection part B2 along a thickness direction are both located between the projections of the first data lines 41 and the second data lines 42. This reduces the misalignment between the first connection part B1 and the second connection part B2 along the first direction X, thereby reducing the structural differences between a structure used to connect the first connection part B1 in the first type driving circuits 11a and a structure used to connect the second connection part B2 in the second type driving circuits 11b. This allows structures of the first type driving circuits 11a and the second type driving circuits 11b to be as consistent as possible, thereby reducing the manufacturing difficulties of the first driving circuits 11.

In some embodiments, along the direction of the display panel thickness, the projection of the first connection part B1 partially overlaps with the projection of the first data line 41.

The first data lines 41 are electrically connected to the first type driving circuits 11a through the first connection part B1. In order to improve the reliability of the connection between the first data lines 41 and the first type driving circuits 11a, in the present disclosure, the projection of the first connection part B1 is made to partially overlap with the projection of the first data lines 41. For example, the projection of the first connection part B1 along the thickness direction can include a strip-like structure extending along the first direction X. This allows for a greater overlap between the projection of the first connection part B1 and the projection of the first data lines 41, thereby improving the electrical conduction reliability between them and enhancing the reliability of data signal transmission.

Of course, in other embodiments, along the direction of the display panel thickness, the projection of the second connection part B2 can also partially overlap with the projection of the second data lines 42. This is not further elaborated in the present disclosure.

Figure 12:
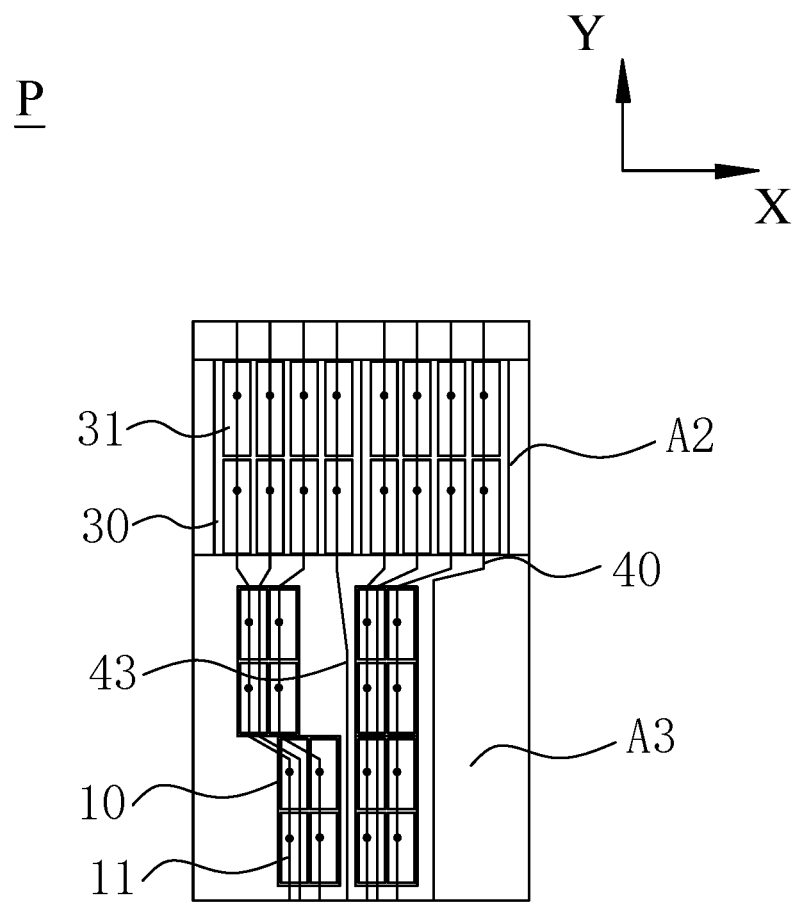
FIG. 12 illustrates a partial enlarged schematic diagram of region P of a display panel according to embodiments of the present disclosure.

In some embodiments, as shown in FIG. 12, quantity of rows of the second driving circuits 31 in one single second circuit group 30 along the second direction Y is the same as quantity of rows of the first driving circuit 11 in one single first circuit group 10 along the second direction Y. The quantity of the second driving circuits 31 in a single second circuit group 30 connected by a same data line 40 is equal to the quantity of the first driving circuits 11 connected to one single first circuit group 10.

Since the quantity of rows of the first driving circuit 11 in the first circuit group 10 is the same as the quantity of rows of the second driving circuit 31 in the second circuit group 30, and the quantity of first driving circuits 11 in the first circuit group 10 is less than the quantity of second driving circuits 31 in the second circuit group 30, the quantity of columns of first driving circuits 11 along the first direction X is less than the quantity of columns of second driving circuits 31 in the first direction X.

Based on this, in the present disclosure, the quantity of second driving circuits 31 in one single second circuit group 30 connected by the same data lines 40 is set to be equal to the quantity of first driving circuits 11 connected to one single first circuit group 10. This allows the connection relationship of the data lines 40 relative to the first driving circuit 11 to approach consistency with the connection relationship of the data lines 40 relative to the second driving circuit 31. The data lines 40 can extend in the same manner at the position of the first circuit group 10 as it does at the position of the second circuit group 30, and the structure of the first driving circuits 11 can be set to be the same as the structure of the second driving circuits 31, further reducing the manufacturing difficulties of the first driving circuits 11.

Figure 13:
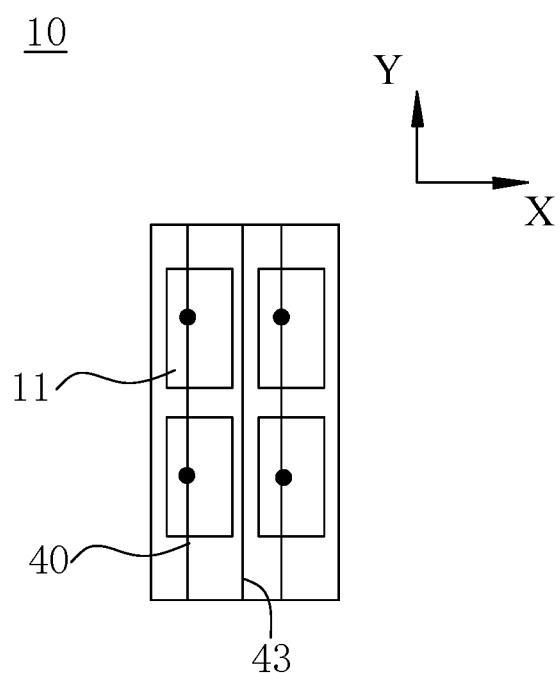
FIG. 13 illustrates an enlarged schematic diagram of the structure of a second circuit group of a display panel according to embodiments of the present disclosure.

In some embodiments, as shown in FIG. 13, the data lines 40 include third data lines 43. Along the direction of the display panel thickness, a portion of the structure projection of the third data lines 43 is located within the projection of the first circuit groups 10, and the third data lines 43 are insulated from the first driving circuits 11. And/or, as shown in FIG. 12, along the thickness direction, a portion of the structure projection of the third data lines 43 is located between the projections of two adjacent first circuit groups 10.

Based on previous discussions, it is known that the quantity of first driving circuits 11 in the first circuit group 10 is less than the quantity of second driving circuits 31 in the second circuit group 30. Quantity of second driving circuits 31 in a single second circuit group 30 connected to a portion of data lines 40 is equal to quantity of first driving circuits 11 connected in a single first circuit group 10. This results in some data lines 40, such as the third data lines 43, being unable to connect to the first driving circuits 11.

To address this situation and meet the extension needs of the third data lines 43, in the present disclosure, the third data lines 43 are positioned between the projections of two first circuit groups 10 or between the projections of two first driving circuits 11 in the first circuit groups 10. This allows for an insulation of the third data lines 43 from the first driving circuits 11 while meeting the extension needs of the third data lines 43.

It should be noted that when the third data lines 43 are positioned between two adjacent first circuit groups 10, it can reduce the capacitance generated between the third data lines 43 and the first driving circuit groups 11 due to overlap, thereby reducing the load on the third data lines 43. When a portion of the structure projection of the third data lines 43 is located in the projection of the first circuit groups 10 and is insulated from the first driving circuits 11, this design makes the arrangement of the data lines 40 more compact, thereby saving space and reducing the capacitance difference between the third data lines 43 and other data lines 40, which is beneficial for improving display uniformity.

Furthermore, when a portion of the structure projection of the third data line 43 is located in the projection of the first circuit group 10, the projection of the third data line 43 can either overlap with the first driving circuits 11 or not. The present disclosure does not limit this, as long as the third data lines 43 can be insulated from the first driving circuits 11.

Figure 14:
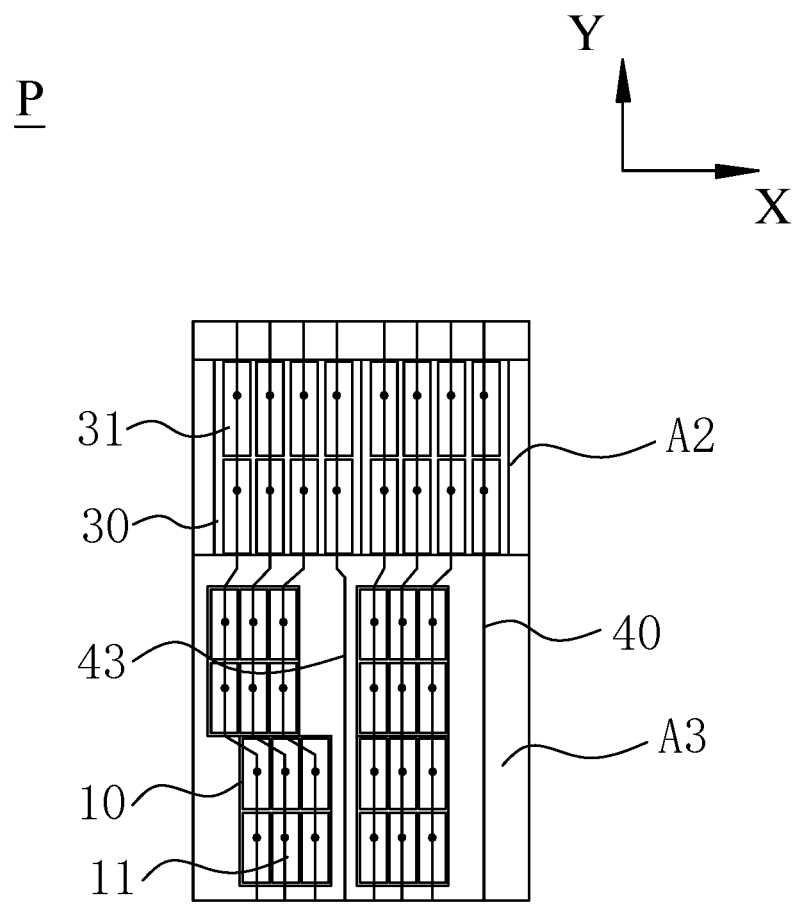
FIG. 14 illustrates an enlarged schematic diagram of the structure of region P of a display panel according to embodiments of the present disclosure.

In some embodiments, as shown in FIG. 14, the second circuit groups 30 include eight second driving circuits 31 arranged in two rows and four columns. The first circuit groups 10 include six first driving circuits 11 arranged in two rows and three columns. Based on this, some data lines 40 connect two second driving circuits 31 in a same column in the second circuit group 30, to two first driving circuits 11 in a same column in the first circuit group 10. One third data line 43 connects two second driving circuits 31 in a same column in the second circuit groups 30. A projection of the third data lines 43 at least partially overlaps with the projection of two first driving circuits 11 in the first circuit group 10. This design allows most of the data lines 40 to simultaneously connect the first driving circuits 11 and the second driving circuits 31, thereby reducing the load difference between most of the data lines 40 and improving the display uniformity and reliability of the display panel.

It should be noted that in FIG. 14, the schematic illustrates a configuration where a front projection of the third data lines 43 is located outside the first circuit groups 10. However, in some embodiments, the front projection of the third data lines 43 can be positioned in the first circuit groups 10, and the front projection of the third data lines 43 can either overlap with or not in the first driving circuit 11. The present disclosure does not impose any restrictions on this.

In some embodiments, as shown in FIG. 12, the dimension of the first circuit groups 10 along the first direction X is smaller than the dimension of the second circuit group 30 along the first direction X.

Due to the small dimension of the transition region A3, in order to accommodate the needs to place the first circuit groups 10. The present disclosure limits the dimension of the first circuit groups 10, making the dimension of the first circuit groups 10 along the first direction X smaller than the dimension of the second circuit groups 30 along the first direction X. There are various methods for limiting the size, such as reducing the quantity of first driving circuits 11 in the first circuit groups 10 or reducing the dimension of individual first driving circuit 11.

In order to meet the placement requirements of the first circuit groups 10 in the transition region A3, the present disclosure limits the dimension of the first circuit groups 10 along the first direction X, making it smaller than the dimension of the second circuit groups 30 along the first direction X, thus allowing for the arrangement of more first circuit groups 10 in the transition region A3 to achieve a better full-screen display.

In some embodiments, the dimension of the first circuit group 10 along the second direction Y is smaller than the dimension of the second circuit groups 30 along the second direction Y.

In some embodiments, in one single first circuit group 10, the distance between adjacent first driving circuits 11 along the first direction X is smaller than the distance between adjacent second driving circuits 31 along the first direction X in one single second circuit group 30.

Based on the discussion, it is necessary to limit the dimension of the first circuit groups 10. Based on this, the present disclosure reduces the spacing between adjacent first driving circuits 11 along the first direction X in the first circuit groups 10 to be smaller than the distance between adjacent second driving circuits 31 along the first direction X in the second circuit groups 30. This achieves a reduction in the dimension of the first circuit groups 10 along the first direction X, thereby facilitating the arrangement of more first circuit groups 10 in the transition region A3, resulting in a better full-screen display effect.

In some other embodiments, it is also possible for the distance between adjacent first driving circuits 11 along the second direction Y in a single first circuit group 10 to be smaller than the distance between adjacent second driving circuits 31 along the second direction Y in a single second circuit group 30. This is not further elaborated in the present disclosure.

In some embodiments, as shown in FIG. 2, the j-th gate signal line $20j$ includes a connected first segment 21 and second segment 22. There are two first segments 21 and are located on both sides of the first region A1 along the first direction X. The second segment 22 is used to connect the two first segments 21 and is arranged around the first region A1. Along the direction of the display panel thickness, a projection of the first segment 21 partially overlaps with the projection of the first circuit groups 10, while a projection of the second segment 22 is offset from the projection of the first circuit groups 10.

The first segments 21 extend along the first direction X, and they are spaced apart along the first direction X. Due to the presence of the first region A1, a direct linear connection between the two first segments 21 is not possible. Instead, a connection is achieved through the second segments 22 arranged around the first region A1. Typically, the shape of the second segments 22 are adapted to the contour shape of the first region A1, for example, if the first region A1 is a circular structure, the second segments 22 may include an arc-shaped structure.

Since the second segments 22 need to be arranged around the first region A1, its presence increases the overall extension length of the j-th gate signal line $20j$, resulting in a longer extension length for the j-th gate signal line $20j$ compared to the extension length of the i-th gate signal line $20i$, thereby causing the self-load of the j-th gate signal line $20j$ to be greater than the self-load of the i-th gate signal line $20i$.

Based on this, in the present disclosure, the dimension L1 along the first direction X between adjacent first circuit groups 10 located in the i-th row of the first circuit rows Hi is set to be greater than the dimension L2 along the first direction X between adjacent first circuit groups 10 located in the j-th row of the first circuit rows Hj. This makes the lateral capacitance in the i-th row of the first circuit rows H greater than the lateral capacitance in the j-th row of the first circuit rows H, thereby causing the i-th gate signal line $20i$ to be more affected by the lateral capacitance compared to the j-th gate signal line $20j$. This optimizes the balance between the load differences of the i-th gate signal line $20i$ and the j-th gate signal line $20j$, making their loads to be consistent, ensuring a consistency of signal transmission, and reducing the risk of display abnormalities.

Figure 15:
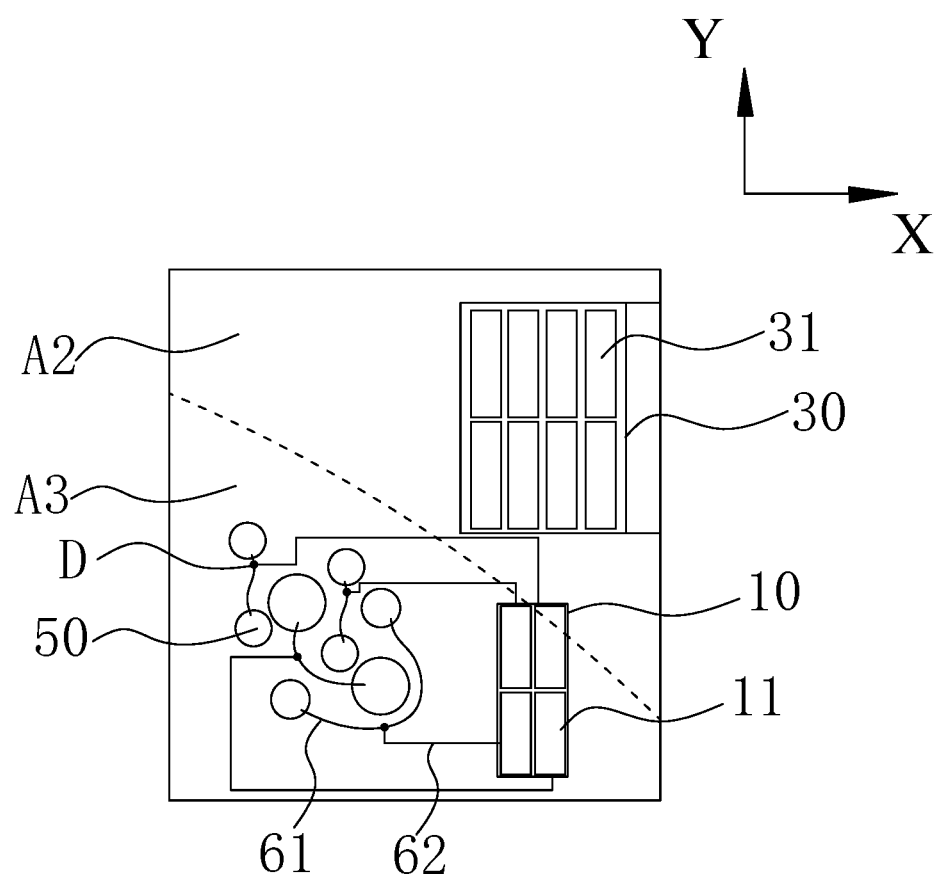
FIG. 15 illustrates a schematic diagram of the connection relationship between the first circuit group and the first light-emitting unit of a display panel according to embodiments of the present disclosure.
Figure 16:
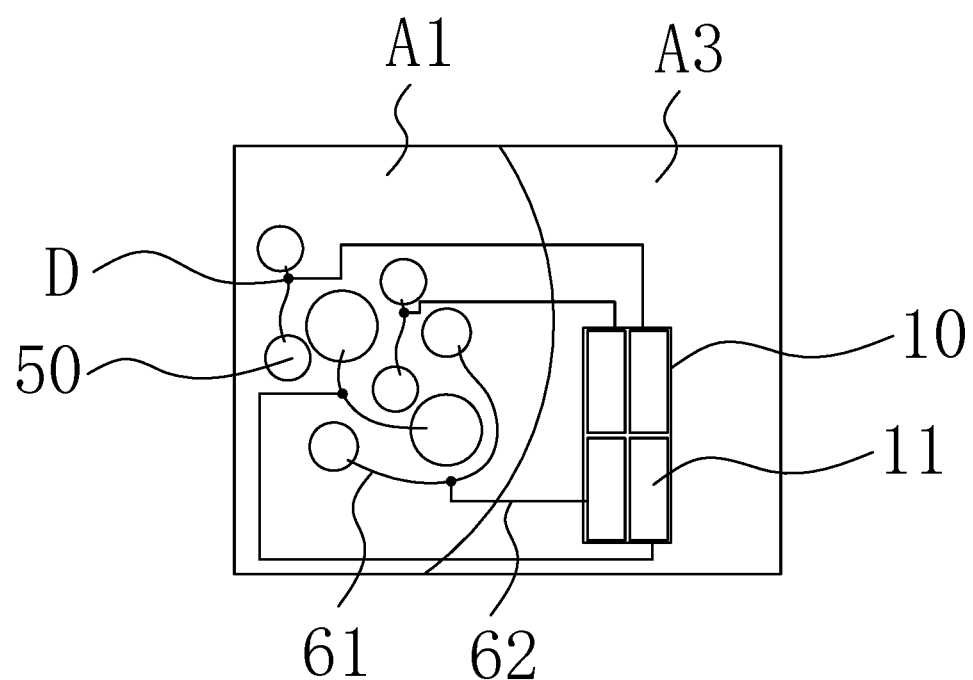
FIG. 16 illustrates a schematic diagram of the connection relationship between first circuit groups and the first light-emitting unit of a display panel according to embodiments of the present disclosure.

In some embodiments, please refer to FIG. 15 and FIG. 16, the display panel further includes first light-emitting units 50 located in either the first region A1 or the transition region A3. The first circuit group 10 comprises the first driving circuits 11, and at least some of the first driving circuits 11 are used to drive the emission of the first light-emitting units 50. FIG. 15 illustrates a schematic diagram of the structure of the first driving circuits 11 driving the first light-emitting units 50 located in the transition region A3. FIG. 16 illustrates a schematic diagram of the structure of the first driving circuits 11 driving the first light-emitting units 50 located in the first region A1.

Since the first circuit groups 10 is in the transition region A3, in order to minimize the quantity of first circuit groups 10 and reduce the size of the transition region A3, in the present disclosure, at least some of the first driving circuits 11 are used to drive the emission of the first light-emitting units 50, achieving a "one-to-many" effect. Thus, a small quantity of first driving circuits 11 can drive a large quantity of first light-emitting units 50, meeting the emission requirements of a larger quantity of first light-emitting units 50. For example, as an illustration, at least some of the first driving circuits 11 are used to drive the emission of two first light-emitting units 50.

It should be noted that for the second circuit groups 30, a second driving circuit 31 inside the second circuit group 30 can drive only one light-emitting unit in the second region A2, that is, the second driving circuit operates in a "one-to-one" driving mode. Therefore, even if quantity of first driving circuits 11 in the first circuit groups 10 is smaller than quantity of second driving circuits 31 in the second circuit groups 30, quantity of light-emitting units that can be driven by the first circuit groups 10 may be greater than or equal to quantity of light-emitting units that can be driven by the second circuit groups 30. This enables a reduction in the overall space occupied by entire first circuit groups 10, thereby reducing the dimension of the transition region A3 and improving the display effect of the display panel.

In some embodiments, the first circuit groups 10 include four first driving circuits 11 arranged in a two-row, two-column layout. Two first driving circuits 11 in a first row are respectively used to drive emissions of red light-emitting units and blue light-emitting units. Two first driving circuits in a second row are both used to drive an emission of green light-emitting units.

The second circuit groups 30 include eight second driving circuits 31 arranged in a two-row, four-column layout. Four second driving circuits 31 in a first row are used sequentially to drive the emission of red light-emitting units, green light-emitting units, blue light-emitting units, and green light-emitting units. Four second driving circuits 31 in a second row are used sequentially to drive the emission of blue light-emitting units, green light-emitting units, red light-emitting units, and green light-emitting units.

In some embodiments, as shown in FIG. 15 and FIG. 16, the display panel further includes a first conductive part 61 and a second conductive part 62. The first conductive part 61 is connected to the first light-emitting units 50, while the second conductive part 62 is connected to the first conductive part 61 and the first driving circuit 11.

The first light-emitting units 50 typically include multiple layers, such as an anode layer, a charge carrier transport layer, a light-emitting layer, an electron transport layer, and a cathode layer. In the present disclosure, the term "the first conductive part 61 is connected to the first light-emitting units 50" means that the first conductive part 61 is simultaneously connected to the anodes of the first light-emitting units 50.

The second conductive part 62 is connected to the first conductive part 61 and the first driving circuits 11. The first driving circuits 11 can transmit a signal to the first conductive part 61 through the second conductive part 62 and simultaneously pass them to the first light-emitting units 50, thereby achieving a control over driving the first light-emitting units 50. Materials of the first conductive part 61 and the second conductive part 62 are not limited in the present disclosure. For example, the first conductive part 61 and the second conductive part 62 may both include metal materials.

It should be noted that in some embodiments, one end of the second conductive part 62 is directly connected to the anode of the first light-emitting units 50. Since the first conductive part 61 is simultaneously connected to the anodes of the first light-emitting units 50, the second conductive part 62 can be connected to the first conductive part 61 through the anode and connected to the anodes of the first light-emitting units 50 through the first conductive part 61. Alternatively, one end of the second conductive part 62 can also be directly connected to the first conductive part 61 to establish electrical connection with the anodes of the first light-emitting units 50.

In the present disclosure, the first conductive part 61 achieves connection with the first light-emitting units 50. A connection between the first conductive part 61 and the second conductive part 62 enables a control over driving the first light-emitting units 50 simultaneous by one single first driving circuit 11. This achieves the effect of controlling the first light-emitting units 50 with a small number of first driving circuits 11.

In some embodiments, one single first conductive part 61 is connected to the first light-emitting units 50 that emit a light of same color.

As described above, one single first driving circuit 11 is capable of simultaneously controlling the first light-emitting units 50 through the first conductive part 61 and the second conductive part 62. Based on this, in order to reduce the risk of display abnormalities, in the present disclosure, one single first conductive part 61 is connected to the first light-emitting units 50 that emit a light of same color. This ensures that the first light-emitting units 50 controlled by one single first driving circuit 11 emit a light of same color, thereby reducing the risk of mutual interference between first light-emitting units 50 and improving display reliability.

In some embodiments, the first circuit groups 10 include rows of first driving circuits 11 along the second Y direction. The first conductive part 61 and the second conductive part 62 are connected at a connection end D. In one single first circuit group 10, an arrangement sequence of the first driving circuits 11 in different rows along the second direction Y is the same as an arrangement sequence of corresponding connection ends D along the second Y direction.

The rows of the first driving circuits 11 need to be connected to the corresponding first conductive part 61 via the second conductive part 62. Referring to the drawings, in one single first circuit group 10, the rows of the first driving circuits 11 are arranged side-by-side from top to bottom. If the connection ends D corresponding to the rows of the first driving circuits 11 are arranged from bottom to top, it can lead to the risk of cross-interference between the first conductive parts 61 connected to different first driving circuits 11, causing issues such as signal crosstalk, which increases the difficulty of the first driving circuits 11 control over driving the first light-emitting units 50.

Therefore, in the present disclosure, the arrangement sequence of the first driving circuits 11 along the second direction Y in different rows is set to be the same as the arrangement sequence of the corresponding connection ends D along the second direction Y. This reduces the risk of cross-interference between different first conductive parts 61 and ensures the reliability of signal transmission in the first conductive part 61.

In some embodiments, at least one of the first conductive part 61 and the second conductive part 62 includes a transparent material.

Since the first driving circuits 11 are in the transition region A3 and the first light-emitting units 50 are in the transition region A3 or the first region A1, the first conductive part 61 and the second conductive part 62 used to connect the first driving circuit 11 to the first light-emitting units 50 can also partially be located in the first region A1.

To improve the light transmittance of the first region A1 and meet light-sensing requirements of the display panel, the present disclosure sets at least one of the first conductive part 61 and the second conductive part 62 to include a transparent material. The presence of the transparent material can satisfy the electrical conduction requirements while enhancing the transmittance of the corresponding area to meet the light-sensing requirements. Examples of transparent material includes at least one of indium tin oxide (ITO), indium zinc oxide, silver-doped indium tin oxide, and silver-doped indium zinc oxide.

Figure 17:
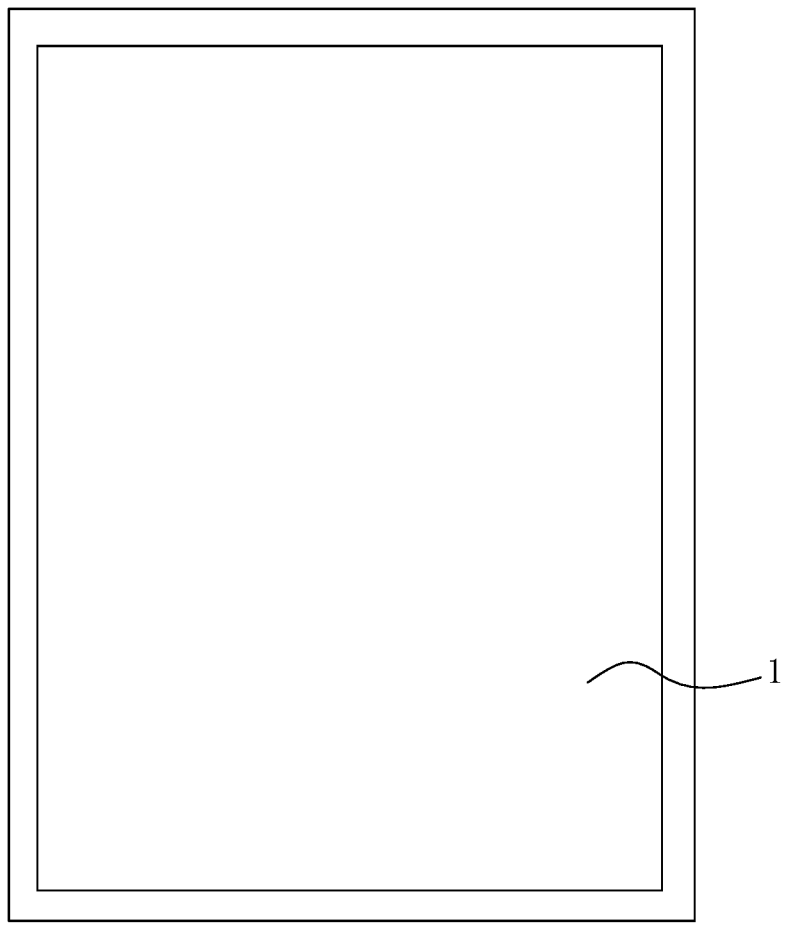
FIG. 17 illustrates a schematic diagram of the structure of a display device according to embodiments of the present disclosure.

In some embodiments, as shown in FIG. 17, a display device 2 is provided, including the display panel 1. The display device 2 provided in the present disclosure includes devices such as mobile phones, computers, tablets, and in-car displays.

It should be noted that the display device provided in the embodiments of the present disclosure exhibits advantageous effects of the display panel described above in any embodiments. For the effects achieved by the display device, please refer to the description provided earlier regarding the display panel.

As disclosed, by setting the dimension L1 of adjacent first circuit groups along the first direction in the i-th row of the first circuit rows to be greater than the dimension L2 of adjacent first circuit groups along the first direction in the j-th row of the first circuit rows, a lateral capacitance of the i-th row of the first circuit rows is larger than a lateral capacitance of the j-th row of the first circuit rows. As a result, the i-th gate signal line is influenced by a larger lateral capacitance compared to the j-th gate signal line, thereby optimizing the balance of the load difference between the i-th gate signal line and the j-th gate signal line, making their loads to be consistent, ensuring similar effects during signal transmission, and reducing the risk of display abnormalities.

Although the embodiments disclosed in the present application have been described above, the disclosed content is merely exemplary embodiments for facilitating understanding of the present disclosure and should not be construed as limiting the invention. Those persons of ordinary skill in the art familiar with the technical field of the present disclosure may make any modifications and changes in form and detail to embodiments without departing from the spirit and scope of the present invention as disclosed in the present application. However, the scope of protection of the present application shall be determined by the claims.

The above description is only a specific implementation of the present disclosure, but the scope of protection of the present disclosure is not limited thereto. Any persons of ordinary skill in the art familiar with the technical field of the present disclosure can easily conceive various equivalent modifications or substitutions within the scope of the technology disclosed in the present disclosure, and such modifications or substitutions should be covered within the scope of protection of the present disclosure. Therefore, the scope of protection of the present disclosure should be determined by the scope of protection of the claims.

What is claimed is:

1. A display panel, comprising:
a first region, a second region, and a transition region between the first region and the second region, wherein a transmittance of the first region is greater than a transmittance of the second region;
first circuit groups located in the transition region, wherein
the first circuit groups are arranged along a first direction to form a first circuit row;
first circuit rows, formed by the first circuit row, are arranged along a second direction;
the first direction intersects the second direction; and
along a direction parallel to the second direction and from a center of the first region towards the second region, the first circuit row is sequentially arranged from a first row to an n-th row, wherein
an i-th row of the first circuit rows is electrically connected to an i-th gate signal line, and adjacent first circuit groups along the i-th gate signal line are separated by a first spacing region;
dimension of the first spacing region along the first direction is L1;
a j-th row of the first circuit rows is electrically connected to a j-th gate signal line, and adjacent first circuit groups along the j-th gate signal line are separated by a second spacing region;
dimension of the second spacing region along the first direction is L2; and
L1>L2; n, i, and j are integers; and 1≤j<i≤n, and
wherein along the direction parallel to the second direction and from the center of the first region towards the second region, among adjacent first circuit rows, a spacing between the adjacent first circuit groups along the first direction gradually increases.

2. The display panel of claim 1, wherein
a first circuit group of the first circuit groups has a dimension of P along the first direction;
a third spacing region is between the adjacent first circuit groups in a q-th row of the first circuit rows, and has a dimension of L3 along the first direction;
$L3=P*a^{b^{q^c}}-P$; and
q, a, b, and c are constants, 1.0002≤a≤1.001, 1.0002≤b≤1.001, 30≤c≤50, and 1≤q≤n.

3. The display panel of claim 1, wherein
along the direction parallel to the second direction and from the center of the first region towards the second region, the transition region sequentially comprises a first transition region and a second transition region;
at least a portion of different first circuit rows in the first transition region has a same spacing between the adjacent first circuit groups along the first direction; and
within at least a portion of the first circuit rows in the second transition region, a spacing between the adjacent first circuit groups along the first direction is greater than a spacing between the adjacent first circuit groups of the first circuit rows along the first direction in within the first transition region.

4. The display panel of claim 3, wherein
a minimum spacing between the adjacent first circuit groups along the first direction in the second transition region is greater than a maximum spacing between the adjacent first circuit groups along the first direction in the first transition region.

5. The display panel of claim 3, wherein
first circuit groups comprise a first type circuit group and a second type circuit group located at both ends of the first circuit row; along the first direction, a distance between the first type circuit group and the second region is greater than a distance between the second type circuit group and the second region; and
in the second transition region:
at least three of first type circuit groups are located along a straight line, and an extension direction of the straight line intersects the second direction, or
at least a portion of second type circuit groups within different first circuit rows are located along an arc segment, or
the first type circuit groups closest to the first transition region can form a line with the center of the first region, forming an angle a (30°≤a≤45°) between the line and the first direction.

6. The display panel of claim 1, wherein
a gate signal line extends along the first direction;
in the transition region, a length of extension of a j-th gate signal line is greater than a length of extension of an i-th gate signal line; and
L1>L2.

7. The display panel of claim 1, further comprising a second circuit group in the second region, wherein
a first circuit group of the first circuit groups comprises first driving circuits;
the second circuit group comprises second driving circuits; and
quantity of a first driving circuit of the first driving circuits in one first circuit group is less than quantity of a second driving circuit of second driving circuits in one second circuit group.

8. The display panel of claim 7, wherein quantity of rows of the second driving circuit in one second circuit group along the second direction equals to quantity of rows of the first driving circuit in one first circuit group along the second direction.

9. The display panel of claim 7, further comprises a data line crossing the transition region along the second direction, wherein
the quantity of second driving circuit in one second circuit group connected to a same data line is less than the quantity of first driving circuit in one first circuit group connected to the same data line.

10. The display panel of claim 9, wherein at least a portion of the data line is used to connect the first driving circuits located in a same column along the second direction.

11. The display panel of claim 10, wherein
data lines, formed by the data line, comprise a first data line and a second data line arranged adjacent to the first data line;
the first driving circuits comprise a first type driving circuit connected to the first data line and a second type driving circuit connected to the second data line;
the first type driving circuit and the second type driving circuit are arranged side-by-side along the second direction;
the first type driving circuit comprises a first connection part electrically connected to the first data line;
the second type driving circuit comprises a second connection part electrically connected to the second data line; and
along a thickness direction of the display panel, a projection of the first connection part and a projection of the second connection part are at least partially located between a projection of the first data line and a projection of the second data line.

12. The display panel of claim 7, wherein
quantity of rows of the second driving circuit in one second circuit group along the second direction equals to quantity of rows of the first driving circuit in one first circuit group along the second direction;
the display panel further comprises a data line extending along the second direction; and
the quantity of the second driving circuit in one second circuit group connected to a same data line extending along the second direction equals to the quantity of the first driving circuit in one first circuit group connected to the same data line extending along the second direction.

13. The display panel of claim 12, wherein
the data line comprises a third data line; and
along a direction of display panel thickness, a projection of a portion of a structure of the third data line is located at least one of:
within a projection of the first circuit group and insulated from the first driving circuit; and
between projections of two adjacent first circuit groups.

14. The display panel of claim 1, further comprising:
a second circuit group located in the second region, wherein at least one of:
a dimension of a first circuit group along the first direction is smaller than a dimension of a second circuit group along the first direction; and
a dimension of the first circuit group along the second direction is smaller than a dimension of the second circuit group along the second direction.

15. The display panel of claim 1, wherein
the j-th gate signal line comprises a first segment and a second segment electrically connected the first segment;

quantity of the first segment is two, and two first segments are positioned on opposite sides of the first region along the first direction;
the second segment is configured to connect the two first segments;
the second segment surrounds the first region;
along a direction of display panel thickness, a projection of the first segment and a projection of the first circuit groups are at least partial overlap; and
a projection of the second segment is offset from the projection of the first circuit groups.

16. The display panel of claim 1, further comprising a first light-emitting unit located in at least the first region or the transition region, wherein
the first circuit group comprise first driving circuits; and
at least a portion of the first driving circuits are configured to drive the first light-emitting unit to emit light.

17. The display panel of claim 16, further comprising a first conductive part and a second conductive part, wherein
the first conductive part is connected to the first light-emitting unit; and
the second conductive part is connected to the first conductive part and the first driving circuits.

18. The display panel of claim 17, wherein
the first circuit groups comprise rows of the first driving circuits along the second direction;
the first conductive part is connected to the second conductive part at connection ends; and
in a first circuit group of the first circuit groups, an arrangement order of the first driving circuits in different rows along the second direction is the same as an arrangement order of corresponding connection ends along the second direction.

19. A display device, comprising:
a first region, a second region, and a transition region between the first region and the second region, wherein a transmittance of the first region is greater than a transmittance of the second region;
first circuit groups located in the transition region, wherein
the first circuit groups are arranged along a first direction to form a first circuit row;
first circuit rows, formed by the first circuit row, are arranged along a second direction;
the first direction intersects the second direction; and
along a direction parallel to the second direction and from a center of the first region towards the second region, the first circuit row is sequentially arranged from a first row to an n-th row, wherein
an i-th row of the first circuit rows is electrically connected to an i-th gate signal line, and adjacent first circuit groups along the i-th gate signal line are separated by a first spacing region;
dimension of the first spacing region along the first direction is L1;
a j-th row of the first circuit rows is electrically connected to a j-th gate signal line, and adjacent first circuit groups along the j-th gate signal line are separated by a second spacing region;
dimension of the second spacing region along the first direction is L2; and
$L1 > L2$; n, i, and j are integers; and $1 \leq j < i \leq n$, and
wherein along the direction parallel to the second direction and from the center of the first region towards the second region, among adjacent first circuit rows, a spacing between the adjacent first circuit groups along the first direction gradually increases.

* * * * *